United States Patent
LaChapelle

(10) Patent No.: US 10,094,925 B1
(45) Date of Patent: Oct. 9, 2018

(54) MULTISPECTRAL LIDAR SYSTEM

(71) Applicant: LUMINAR TECHNOLOGIES, INC., Orlando, FL (US)

(72) Inventor: Joseph G. LaChapelle, Philomath, OR (US)

(73) Assignee: LUMINAR TECHNOLOGIES, INC., Orlando, FL (US)

( * ) Notice: Subject to any disclaimer, the term of this patent is extended or adjusted under 35 U.S.C. 154(b) by 0 days.

(21) Appl. No.: 15/943,498

(22) Filed: Apr. 2, 2018

Related U.S. Application Data

(60) Provisional application No. 62/480,349, filed on Mar. 31, 2017.

(51) Int. Cl.

| | | |
|---|---|---|
| *G01C 3/08* | (2006.01) | |
| *G01S 17/08* | (2006.01) | |
| *H01L 27/146* | (2006.01) | |
| *G01S 17/89* | (2006.01) | |
| *G01S 7/483* | (2006.01) | |
| *G01S 7/481* | (2006.01) | |

(52) U.S. Cl.
CPC .............. *G01S 17/08* (2013.01); *G01S 7/483* (2013.01); *G01S 7/4817* (2013.01); *G01S 17/89* (2013.01); *H01L 27/14643* (2013.01)

(58) Field of Classification Search
CPC ...... G01S 7/484; G01S 7/4817; G01S 7/4816; G01S 7/4865
USPC ....................................................... 356/5.01
See application file for complete search history.

(56) References Cited

U.S. PATENT DOCUMENTS

| | | |
|---|---|---|
| 6,449,384 B2 | 9/2002 | Laumeyer et al. |
| 6,710,324 B2 | 3/2004 | Hipp |
| 6,723,975 B2 | 4/2004 | Saccomanno |
| 6,747,747 B2 | 6/2004 | Hipp |
| 6,759,649 B2 | 7/2004 | Hipp |
| 7,092,548 B2 | 8/2006 | Laumeyer et al. |
| 7,209,221 B2 | 4/2007 | Breed et al. |
| 7,345,271 B2 | 3/2008 | Boehlau et al. |
| 7,443,903 B2 | 10/2008 | Leonardo et al. |
| 7,532,311 B2 | 5/2009 | Henderson et al. |
| 7,570,793 B2 | 8/2009 | Lages et al. |
| 7,583,364 B1 | 9/2009 | Mayor et al. |
| 7,649,920 B2 | 1/2010 | Welford |
| 7,652,752 B2 | 1/2010 | Fetzer et al. |
| 7,872,794 B1 | 1/2011 | Minelly et al. |

(Continued)

*Primary Examiner* — Mark Hellner
(74) *Attorney, Agent, or Firm* — Marshall, Gerstein & Borun LLP

(57) ABSTRACT

A multispectral lidar system includes a laser configured to emit a pulse of light including a first wavelength, scanner configured to direct the emitted pulse of light in accordance with a scan pattern, a receiver including a first detector and a second detector, and a controller. The first detector is configured to detect the emitted pulse of light scattered by a remote target, and the second detector is configured to detect light scattered or emitted by the remote target and including a second wavelength. The scanner provides, at any point in time, a fixed spatial relationship between the fields of view over which the light with the first wavelength and the second wavelength is received. A controller can determine a distance to the remote target and use this distance to modify a measurement of the property of the remote target based on the light detected by the second detector.

25 Claims, 16 Drawing Sheets

(56) References Cited

U.S. PATENT DOCUMENTS

| | | |
|---|---|---|
| 7,902,570 B2 | 3/2011 | Itzler et al. |
| 7,945,408 B2 | 5/2011 | Dimsdale et al. |
| 7,969,558 B2 | 6/2011 | Hall |
| 7,995,796 B2 | 8/2011 | Retterath et al. |
| 8,059,263 B2 | 11/2011 | Haberer et al. |
| 8,072,663 B2 | 12/2011 | O'Neill et al. |
| 8,081,301 B2 | 12/2011 | Stann et al. |
| 8,138,849 B2 | 3/2012 | West et al. |
| 8,279,420 B2 | 10/2012 | Ludwig et al. |
| 8,280,623 B2 | 10/2012 | Trepagnier et al. |
| 8,346,480 B2 | 1/2013 | Trepagnier et al. |
| 8,364,334 B2 | 1/2013 | Au et al. |
| 8,452,561 B2 | 5/2013 | Dimsdale et al. |
| 8,548,014 B2 | 10/2013 | Fermann et al. |
| 8,625,080 B2 | 1/2014 | Heizmann et al. |
| 8,675,181 B2 | 3/2014 | Hall |
| 8,723,955 B2 | 5/2014 | Kiehn et al. |
| 8,767,190 B2 | 7/2014 | Hall |
| 8,796,605 B2 | 8/2014 | Mordarski et al. |
| 8,836,922 B1 | 9/2014 | Pennecot et al. |
| 8,880,296 B2 | 11/2014 | Breed |
| 8,896,818 B2* | 11/2014 | Walsh .............. G01S 7/4818 356/3.01 |
| 8,934,509 B2 | 1/2015 | Savage-Leuchs et al. |
| 9,000,347 B2 | 4/2015 | Woodward et al. |
| 9,041,136 B2 | 5/2015 | Chia |
| 9,048,370 B1 | 6/2015 | Urmson et al. |
| 9,063,549 B1 | 6/2015 | Pennecot et al. |
| 9,069,060 B1 | 6/2015 | Zbrozek et al. |
| 9,074,878 B2 | 7/2015 | Steffey et al. |
| 9,086,273 B1 | 7/2015 | Gruver et al. |
| 9,086,481 B1 | 7/2015 | Dowdall et al. |
| 9,091,754 B2 | 7/2015 | d'Aligny |
| 9,103,669 B2 | 8/2015 | Giacotto et al. |
| 9,121,703 B1 | 9/2015 | Droz et al. |
| 9,160,140 B2 | 10/2015 | Gusev et al. |
| 9,170,333 B2 | 10/2015 | Mheen et al. |
| 9,199,641 B2 | 12/2015 | Ferguson et al. |
| 9,213,085 B2 | 12/2015 | Kanter |
| 9,239,260 B2 | 1/2016 | Bayha et al. |
| 9,246,041 B1 | 1/2016 | Clausen et al. |
| 9,285,464 B2 | 3/2016 | Pennecot et al. |
| 9,285,477 B1 | 3/2016 | Smith et al. |
| 9,297,901 B2 | 3/2016 | Bayha et al. |
| 9,299,731 B1 | 3/2016 | Lenius et al. |
| 9,304,154 B1 | 4/2016 | Droz et al. |
| 9,304,203 B1 | 4/2016 | Droz et al. |
| 9,304,316 B2 | 4/2016 | Weiss et al. |
| 9,310,471 B2 | 4/2016 | Sayyah et al. |
| 9,335,255 B2 | 5/2016 | Retterath et al. |
| 9,360,554 B2 | 6/2016 | Retterath et al. |
| 9,368,933 B1 | 6/2016 | Nijjar et al. |
| 9,383,201 B2 | 7/2016 | Jachman et al. |
| 9,383,445 B2 | 7/2016 | Lu et al. |
| 9,383,753 B1 | 7/2016 | Templeton et al. |
| 2006/0290920 A1 | 12/2006 | Kampchen et al. |
| 2009/0273770 A1 | 11/2009 | Bauhahn et al. |
| 2010/0034221 A1 | 2/2010 | Dragic |
| 2012/0227263 A1 | 9/2012 | Leclair et al. |
| 2013/0033742 A1 | 2/2013 | Rogers et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0293263 A1 | 10/2014 | Justice et al. |
| 2014/0293266 A1 | 10/2014 | Hsu et al. |
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0301182 A1 | 10/2015 | Geiger et al. |
| 2015/0323654 A1 | 11/2015 | Jachmann et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047901 A1 | 2/2016 | Pacala et al. |
| 2016/0049765 A1 | 2/2016 | Eldada |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2017/0310948 A1* | 10/2017 | Pei .................. G01S 17/10 |
| 2018/0032042 A1 | 2/2018 | Turpin et al. |

* cited by examiner

MULTISPECTRAL LIDAR SYSTEM

CROSS-REFERENCE TO RELATED APPLICATION

This application claims priority to provisional U.S. Application Ser. No. 62/480,349, filed on Mar. 31, 2017, entitled "Improving Operation of a Lidar System," the entire disclosure of which is hereby expressly incorporated by reference herein.

FIELD OF TECHNOLOGY

This disclosure generally relates to lidar systems and, more particularly, a lidar system that uses optical signals including a certain wavelength to adjust measurements of optical signals including other wavelengths.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

SUMMARY

One example embodiment of the techniques of this disclosure is a multispectral lidar system comprising a laser configured to emit a pulse of light including a first wavelength, a scanner configured to direct the emitted pulse of light in accordance with a scan pattern, a receiver including a first detector and a second detector, and a controller. The first detector is configured to detect, over a first angular region defining a first detector field of view (FOV), the emitted pulse of light scattered by a remote target. The second detector is configured to detect, over a second angular region defining a second detector FOV, light scattered or emitted by the remote target and including a second wavelength. The scanner provides, at any point in time, a fixed spatial relationship between the first detector FOV and the second detector FOV. The controller is configured to (i) determine a distance to the remote target using the light detected by the first detector, (ii) generate a measurement of a property of the remote target based on the light detected by the second detector, and (iii) modify the generated measurement of the property of the remote target using the determined distance to the remote target.

Another example embodiment of the techniques of this disclosure is a method in a multispectral lidar system for multispectral scanning. The method comprises emitting a pulse of light including a first wavelength; detecting the emitted pulse of light pulse of light scattered by a remote target; over a first angular region defining a first field of view (FOV); detecting light scattered or emitted by the remote target and including a second wavelength, over a second angular region defining a second FOV, where the first FOV and the second FOV have a fixed spatial relationship in accordance with the scan pattern; determining a distance to the remote target using the light detected over the first FOV; generating a measurement of a property of the remote target based on the light detected over the second FOV; and modifying the generated measurement of the property of the remote target using the determined distance to the remote target.

DETAILED DESCRIPTION

Overview

A multispectral lidar system includes a scanner to scan a two-dimensional field of regard to obtain distance-to-target information at various angles using a laser output beam and a primary detector. The multispectral lidar system also includes one or more secondary detectors configured to detect optical signals at wavelengths other than the wavelength of the laser used for ranging. The multispectral lidar system collects the additional angularly-correlated information using the same scanner that is used for collecting range information. The scanner thus provides, at any point in time, a fixed spatial relationship between the FOV of the primary detector and the FOV of the secondary detector.

The ranging signal of the lidar can lie in the short-wave infrared (SWIR) portion of the spectrum, while a secondary detector can be configured to detect a range of visible wavelengths, or a range of infrared wavelengths other than the wavelength used for distance ranging. A range of wavelengths that corresponds to a given detector can be processed a separate signal. The measurements computed from different signals, on the other hand, may be combined in a way that allows one measurement to modify another. For example, if the first signal results in a measured distance, while the second signal results in a measurement indicative of target size, one may modify the size measurement by the distance in order to yield a more accurate size measurement. Additionally or alternatively, if the first signal results in a measured emissivity, while the second signal results in a measurement indicative of target temperature, a controller can modify the temperature measurement using the detected emissivity to generate a more accurate temperature measurement.

The one or more secondary detectors can share the optics with the primary detector used with the ranging signals and lie at different locations on the same image plane. In these implementations, each detector can have a different field of view from the other detectors at any given time during the scan. In other implementations, different optical signals can be separated by filtering optics. In these implementations, additional focusing optics can be used to focus different optical signals onto corresponding detectors. In these implementations, different optical signals can have overlapping or coincident fields of view at any given time.

A secondary detector can be configured for passive or active sensing. In passive sensing, the secondary detector can collect ambient light scattered by targets in a scene, or light radiated from the targets. In active sensing, a secondary light source can be configured to illuminate the field of view of the secondary detector. In these implementations, the secondary detector collects light emitted by a secondary light source and subsequently scattered by targets within the field of view of the detector.

System Overview

Figure 1:
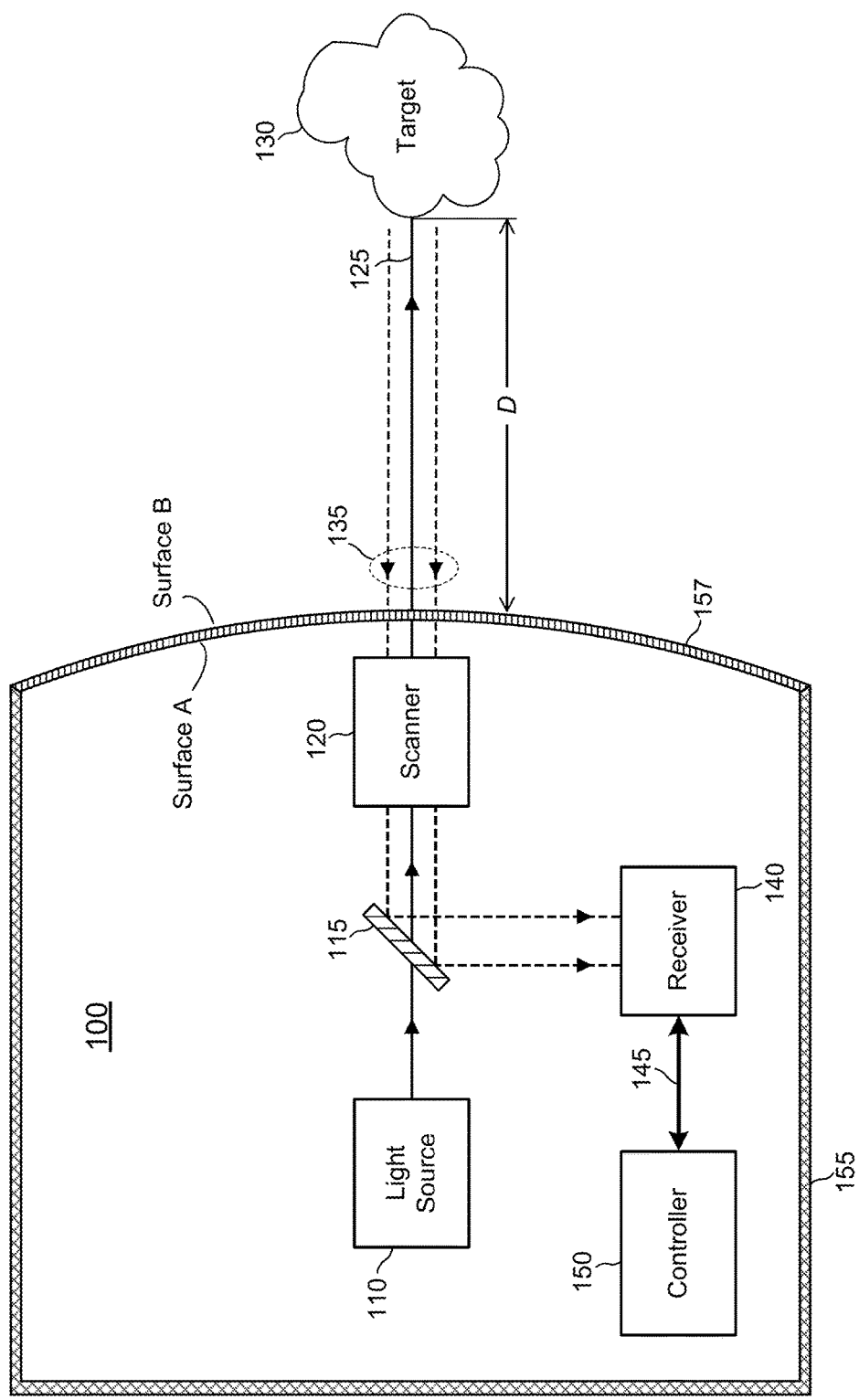
FIG. 1 is a block diagram of an example light detection and ranging (lidar) system in which the techniques of this disclosure can be implemented.

FIG. 1 illustrates an example light detection and ranging (lidar) system 100. The lidar system 100 may be referred to as a laser ranging system, a laser radar system, a LIDAR system, a lidar sensor, or a laser detection and ranging (LADAR or ladar) system. The lidar system 100 may include a light source 110, a mirror 115, a scanner 120, a receiver 140, and a controller 150. The light source 110 may be, for example, a laser which emits light having a particular operating wavelength in the infrared, visible, or ultraviolet portions of the electromagnetic spectrum. As a more specific example, the light source 110 may include a laser with an operating wavelength between approximately 1.2 µm and 1.7 µm.

In operation, the light source 110 emits an output beam of light 125 which may be continuous-wave, pulsed, or modulated in any suitable manner for a given application. The output beam of light 125 is directed downrange toward a remote target 130 located a distance D from the lidar system 100 and at least partially contained within a field of regard of the system 100. Depending on the scenario and/or the implementation of the lidar system 100, D can be between 1 m and 1 km, for example.

Once the output beam 125 reaches the downrange target 130, the target 130 may scatter or, in some cases, reflect at least a portion of light from the output beam 125, and some of the scattered or reflected light may return toward the lidar system 100. In the example of FIG. 1, the scattered or reflected light is represented by input beam 135, which passes through the scanner 120, which may be referred to as a beam scanner, optical scanner, or laser scanner. The input beam 135 passes through the scanner 120 to the mirror 115, which may be referred to as an overlap mirror, superposition mirror, or beam-combiner mirror. The mirror 115 in turn directs the input beam 135 to the receiver 140. The input 135 may contain only a relatively small fraction of the light from the output beam 125. For example, the ratio of average power, peak power, or pulse energy of the input beam 135 to average power, peak power, or pulse energy of the output beam 125 may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of the output beam 125 has a pulse energy of 1 microjoule (µJ), then the pulse energy of a corresponding pulse of the input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, or 1 aJ.

The output beam 125 may be referred to as a laser beam, light beam, optical beam, emitted beam, or just beam; and the input beam 135 may be referred to as a return beam, received beam, return light, received light, input light, scattered light, or reflected light. As used herein, scattered light may refer to light that is scattered or reflected by the target 130. The input beam 135 may include light from the output beam 125 that is scattered by the target 130, light from the output beam 125 that is reflected by the target 130, or a combination of scattered and reflected light from target 130.

The operating wavelength of a lidar system 100 may lie, for example, in the infrared, visible, or ultraviolet portions of the electromagnetic spectrum. The Sun also produces light in these wavelength ranges, and thus sunlight can act as background noise which can obscure signal light detected by the lidar system 100. This solar background noise can result in false-positive detections or can otherwise corrupt measurements of the lidar system 100, especially when the receiver 140 includes SPAD detectors (which can be highly sensitive).

Generally speaking, the light from the Sun that passes through the Earth's atmosphere and reaches a terrestrial-based lidar system such as the system 100 can establish an optical background noise floor for this system. Thus, in order for a signal from the lidar system 100 to be detectable, the signal must rise above the background noise floor. It is generally possible to increase the signal-to-noise (SNR) ratio of the lidar system 100 by raising the power level of the output beam 125, but in some situations it may be desirable to keep the power level of the output beam 125 relatively low. For example, increasing transmit power levels of the output beam 125 can result in the lidar system 100 not being eye-safe.

In some implementations, the lidar system 100 operates at one or more wavelengths between approximately 1400 nm and approximately 1600 nm. For example, the light source 110 may produce light at approximately 1550 nm.

In some implementations, the lidar system 100 operates at frequencies at which atmospheric absorption is relatively low. For example, the lidar system 100 can operate at wavelengths in the approximate ranges from 980 nm to 1110 nm or from 1165 nm to 1400 nm.

In other implementations, the lidar system 100 operates at frequencies at which atmospheric absorption is high. For example, the lidar system 100 can operate at wavelengths in the approximate ranges from 930 nm to 980 nm, from 1100 nm to 1165 nm, or from 1400 nm to 1460 nm.

According to some implementations, the lidar system 100 can include an eye-safe laser, or the lidar system 100 can be classified as an eye-safe laser system or laser product. An eye-safe laser, laser system, or laser product may refer to a system with an emission wavelength, average power, peak power, peak intensity, pulse energy, beam size, beam divergence, exposure time, or scanned output beam such that emitted light from the system presents little or no possibility of causing damage to a person's eyes. For example, the light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In some implementations, the lidar system 100 may be classified as an eye-safe laser product (e.g., with a Class 1 or Class I classification) configured to operate at any suitable wavelength between approximately 1400 nm and approximately 2100 nm. In some implementations, the light source 110 may include a laser with an operating wavelength between approximately 1400 nm and approximately 1600 nm, and the lidar system 100 may be operated in an eye-safe manner. In some implementations, the light source 110 or the lidar system 100 may be an eye-safe laser product that includes a scanned laser with an operating wavelength between approximately 1530 nm and approximately 1560 nm. In some implementations, the lidar system 100 may be a Class 1 or Class I laser product that includes a fiber laser or solid-state laser with an operating wavelength between approximately 1400 nm and approximately 1600 nm.

The receiver 140 may receive or detect photons from the input beam 135 and generate one or more representative signals. For example, the receiver 140 may generate an output electrical signal 145 that is representative of the input beam 135. The receiver may send the electrical signal 145 to the controller 150. Depending on the implementation, the controller 150 may include one or more processors, an application-specific integrated circuit (ASIC), a field-programmable gate array (FPGA), and/or other suitable circuitry configured to analyze one or more characteristics of the electrical signal 145 to determine one or more characteristics of the target 130, such as its distance downrange from the lidar system 100. More particularly, the controller 150 may analyze the time of flight or phase modulation for the beam of light 125 transmitted by the light source 110. If the lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as $D = c \cdot T/2$, where c is the speed of light (approximately $3.0 \times 10^8$ m/s).

As a more specific example, if the lidar system 100 measures the time of flight to be T=300 ns, then the lidar system 100 can determine the distance from the target 130 to the lidar system 100 to be approximately D=45.0 m. As another example, the lidar system 100 measures the time of flight to be T=1.33 μs and accordingly determines that the distance from the target 130 to the lidar system 100 is approximately D=199.5 m. The distance D from lidar system 100 to the target 130 may be referred to as a distance, depth, or range of the target 130. As used herein, the speed of light c refers to the speed of light in any suitable medium, such as for example in air, water, or vacuum. The speed of light in vacuum is approximately $2.9979 \times 10^8$ m/s, and the speed of light in air (which has a refractive index of approximately 1.0003) is approximately $2.9970 \times 10^8$ m/s.

The target 130 may be located a distance D from the lidar system 100 that is less than or equal to a maximum range $R_{MAX}$ of the lidar system 100. The maximum range $R_{MAX}$ (which also may be referred to as a maximum distance) of a lidar system 100 may correspond to the maximum distance over which the lidar system 100 is configured to sense or identify targets that appear in a field of regard of the lidar system 100. The maximum range of lidar system 100 may be any suitable distance, such as for example, 25 m, 50 m, 100 m, 200 m, 500 m, or 1 km. As a specific example, a lidar system with a 200-m maximum range may be configured to sense or identify various targets located up to 200 m away. For a lidar system with a 200-m maximum range ($R_{MAX}$=200 m), the time of flight corresponding to the maximum range is approximately $2 \cdot R_{MAX}/c \cong 1.33$ μs.

In some implementations, the light source 110, the scanner 120, and the receiver 140 may be packaged together within a single housing 155, which may be a box, case, or enclosure that holds or contains all or part of a lidar system 100. The housing 155 includes a window 157 through which the beams 125 and 135 pass. In one example implementation, the lidar-system housing 155 contains the light source 110, the overlap mirror 115, the scanner 120, and the receiver 140 of a lidar system 100. The controller 150 may reside within the same housing 155 as the components 110, 120, and 140, or the controller 150 may reside remotely from the housing.

Moreover, in some implementations, the housing 155 includes multiple lidar sensors, each including a respective scanner and a receiver. Depending on the particular implementation, each of the multiple sensors can include a separate light source or a common light source. The multiple sensors can be configured to cover non-overlapping adjacent fields of regard or partially overlapping fields of regard, depending on the implementation.

The housing 155 may be an airtight or watertight structure that prevents water vapor, liquid water, dirt, dust, or other contaminants from getting inside the housing 155. The housing 155 may be filled with a dry or inert gas, such as for example dry air, nitrogen, or argon. The housing 155 may include one or more electrical connections for conveying electrical power or electrical signals to and/or from the housing.

The window 157 may be made from any suitable substrate material, such as for example, glass or plastic (e.g., polycarbonate, acrylic, cyclic-olefin polymer, or cyclic-olefin copolymer). The window 157 may include an interior surface (surface A) and an exterior surface (surface B), and surface A or surface B may include a dielectric coating having particular reflectivity values at particular wavelengths. A dielectric coating (which may be referred to as a thin-film coating, interference coating, or coating) may include one or more thin-film layers of dielectric materials (e.g., $SiO_2$, $TiO_2$, $Al_2O_3$, $Ta_2O_5$, $MgF_2$, $LaF_3$, or $AlF_3$) having particular thicknesses (e.g., thickness less than 1 μm) and particular refractive indices. A dielectric coating may be deposited onto surface A or surface B of the window 157 using any suitable deposition technique, such as for example, sputtering or electron-beam deposition.

The dielectric coating may have a high reflectivity at a particular wavelength or a low reflectivity at a particular wavelength. A high-reflectivity (HR) dielectric coating may have any suitable reflectivity value (e.g., a reflectivity greater than or equal to 80%, 90%, 95%, or 99%) at any suitable wavelength or combination of wavelengths. A low-reflectivity dielectric coating (which may be referred to as an anti-reflection (AR) coating) may have any suitable reflectivity value (e.g., a reflectivity less than or equal to 5%, 2%, 1%, 0.5%, or 0.2%) at any suitable wavelength or combination of wavelengths. In particular embodiments, a dielectric coating may be a dichroic coating with a particular combination of high or low reflectivity values at particular wavelengths. For example, a dichroic coating may have a reflectivity of less than or equal to 0.5% at approximately 1550-1560 nm and a reflectivity of greater than or equal to 90% at approximately 800-1500 nm.

In some implementations, surface A or surface B has a dielectric coating that is anti-reflecting at an operating wavelength of one or more light sources 110 contained within enclosure 155. An AR coating on surface A and surface B may increase the amount of light at an operating wavelength of light source 110 that is transmitted through the window 157. Additionally, an AR coating at an operating wavelength of the light source 110 may reduce the amount of incident light from output beam 125 that is reflected by the window 157 back into the housing 155. In an example implementation, each of surface A and surface B has an AR coating with reflectivity less than 0.5% at an operating wavelength of light source 110. As an example, if the light source 110 has an operating wavelength of approximately 1550 nm, then surface A and surface B may each have an AR coating with a reflectivity that is less than 0.5% from approximately 1547 nm to approximately 1553 nm. In another implementation, each of surface A and surface B has an AR coating with reflectivity less than 1% at the operating wavelengths of the light source 110. For example, if the housing 155 encloses two sensor heads with respective light sources, the first light source emits pulses at a wavelength of approximately 1535 nm and the second light source emits pulses at a wavelength of approximately 1540 nm, then surface A and surface B may each have an AR coating with reflectivity less than 1% from approximately 1530 nm to approximately 1545 nm.

The window 157 may have an optical transmission that is greater than any suitable value for one or more wavelengths of one or more light sources 110 contained within the housing 155. As an example, the window 157 may have an optical transmission of greater than or equal to 70%, 80%, 90%, 95%, or 99% at a wavelength of light source 110. In one example implementation, the window 157 can transmit greater than or equal to 95% of light at an operating wavelength of the light source 110. In another implementation, the window 157 transmits greater than or equal to 90% of light at the operating wavelengths of the light sources enclosed within the housing 155.

Surface A or surface B may have a dichroic coating that is anti-reflecting at one or more operating wavelengths of one or more light sources 110 and high-reflecting at wavelengths away from the one or more operating wavelengths. For example, surface A may have an AR coating for an operating wavelength of the light source 110, and surface B may have a dichroic coating that is AR at the light-source operating wavelength and HR for wavelengths away from the operating wavelength. A coating that is HR for wavelengths away from a light-source operating wavelength may prevent most incoming light at unwanted wavelengths from being transmitted through the window 117. In one implementation, if light source 110 emits optical pulses with a wavelength of approximately 1550 nm, then surface A may have an AR coating with a reflectivity of less than or equal to 0.5% from approximately 1546 nm to approximately 1554 nm. Additionally, surface B may have a dichroic coating that is AR at approximately 1546-1554 nm and HR (e.g., reflectivity of greater than or equal to 90%) at approximately 800-1500 nm and approximately 1580-1700 nm.

Surface B of the window 157 may include a coating that is oleophobic, hydrophobic, or hydrophilic. A coating that is oleophobic (or, lipophobic) may repel oils (e.g., fingerprint oil or other non-polar material) from the exterior surface (surface B) of the window 157. A coating that is hydrophobic may repel water from the exterior surface. For example, surface B may be coated with a material that is both oleophobic and hydrophobic. A coating that is hydrophilic attracts water so that water may tend to wet and form a film on the hydrophilic surface (rather than forming beads of water as may occur on a hydrophobic surface). If surface B has a hydrophilic coating, then water (e.g., from rain) that lands on surface B may form a film on the surface. The surface film of water may result in less distortion, deflection, or occlusion of an output beam 125 than a surface with a non-hydrophilic coating or a hydrophobic coating.

With continued reference to FIG. 1, the light source 110 may include a pulsed laser configured to produce or emit pulses of light with a certain pulse duration. In an example implementation, the pulse duration or pulse width of the pulsed laser is approximately 10 picoseconds (ps) to 100 nanoseconds (ns). In another implementation, the light source 110 is a pulsed laser that produces pulses with a pulse duration of approximately 1-4 ns. In yet another implementation, the light source 110 is a pulsed laser that produces pulses at a pulse repetition frequency of approximately 100 kHz to 5 MHz or a pulse period (e.g., a time between consecutive pulses) of approximately 200 ns to 10 μs. The light source 110 may have a substantially constant or a variable pulse repetition frequency, depending on the implementation. As an example, the light source 110 may be a pulsed laser that produces pulses at a substantially constant pulse repetition frequency of approximately 640 kHz (e.g., 640,000 pulses per second), corresponding to a pulse period of approximately 1.56 μs. As another example, the light source 110 may have a pulse repetition frequency that can be varied from approximately 500 kHz to 3 MHz. As used herein, a pulse of light may be referred to as an optical pulse, a light pulse, or a pulse, and a pulse repetition frequency may be referred to as a pulse rate.

In general, the output beam 125 may have any suitable average optical power, and the output beam 125 may include optical pulses with any suitable pulse energy or peak optical power. Some examples of the average power of the output beam 125 include the approximate values of 1 mW, 10 mW, 100 mW, 1 W, and 10 W. Example values of pulse energy of the output beam 125 include the approximate values of 0.1

µJ, 1 µJ, 10 µJ, 100 µJ, and 1 mJ. Examples of peak power values of pulses included in the output beam 125 are the approximate values of 10 W, 100 W, 1 kW, 5 kW, 10 kW. An example optical pulse with a duration of 1 ns and a pulse energy of 1 µJ has a peak power of approximately 1 kW. If the pulse repetition frequency is 500 kHz, then the average power of the output beam 125 with 1-µJ pulses is approximately 0.5 W, in this example.

The light source 110 may include a laser diode, such as a Fabry-Perot laser diode, a quantum well laser, a distributed Bragg reflector (DBR) laser, a distributed feedback (DFB) laser, or a vertical-cavity surface-emitting laser (VCSEL). The laser diode operating in the light source 110 may be an aluminum-gallium-arsenide (AlGaAs) laser diode, an indium-gallium-arsenide (InGaAs) laser diode, or an indium-gallium-arsenide-phosphide (InGaAsP) laser diode, or any other suitable diode. In some implementations, the light source 110 includes a pulsed laser diode with a peak emission wavelength of approximately 1400-1600 nm. Further, the light source 110 may include a laser diode that is current-modulated to produce optical pulses.

In some implementations, the light source 110 includes a pulsed laser diode followed by one or more optical-amplification stages. For example, the light source 110 may be a fiber-laser module that includes a current-modulated laser diode with a peak wavelength of approximately 1550 nm, followed by a single-stage or a multi-stage erbium-doped fiber amplifier (EDFA). As another example, the light source 110 may include a continuous-wave (CW) or quasi-CW laser diode followed by an external optical modulator (e.g., an electro-optic modulator), and the output of the modulator may be fed into an optical amplifier. In other implementations, the light source 110 may include a laser diode which produces optical pulses that are not amplified by an optical amplifier. As an example, a laser diode (which may be referred to as a direct emitter or a direct-emitter laser diode) may emit optical pulses that form an output beam 125 that is directed downrange from a lidar system 100. In yet other implementations, the light source 110 may include a pulsed solid-state laser or a pulsed fiber laser.

In some implementations, the output beam of light 125 emitted by the light source 110 is a collimated optical beam with any suitable beam divergence, such as a divergence of approximately 0.1 to 3.0 milliradian (mrad). Divergence of the output beam 125 may refer to an angular measure of an increase in beam size (e.g., a beam radius or beam diameter) as the output beam 125 travels away from the light source 110 or the lidar system 100. The output beam 125 may have a substantially circular cross section with a beam divergence characterized by a single divergence value. For example, the output beam 125 with a circular cross section and a divergence of 1 mrad may have a beam diameter or spot size of approximately 10 cm at a distance of 100 m from the lidar system 100. In some implementations, the output beam 125 may be an astigmatic beam or may have a substantially elliptical cross section and may be characterized by two divergence values. As an example, the output beam 125 may have a fast axis and a slow axis, where the fast-axis divergence is greater than the slow-axis divergence. As another example, the output beam 125 may be an astigmatic beam with a fast-axis divergence of 2 mrad and a slow-axis divergence of 0.5 mrad.

The output beam of light 125 emitted by light source 110 may be unpolarized or randomly polarized, may have no specific or fixed polarization (e.g., the polarization may vary with time), or may have a particular polarization (e.g., the output beam 125 may be linearly polarized, elliptically polarized, or circularly polarized). As an example, the light source 110 may produce linearly polarized light, and the lidar system 100 may include a quarter-wave plate that converts this linearly polarized light into circularly polarized light. The lidar system 100 may transmit the circularly polarized light as the output beam 125, and receive the input beam 135, which may be substantially or at least partially circularly polarized in the same manner as the output beam 125 (e.g., if the output beam 125 is right-hand circularly polarized, then the input beam 135 may also be right-hand circularly polarized). The input beam 135 may pass through the same quarter-wave plate (or a different quarter-wave plate), resulting in the input beam 135 being converted to linearly polarized light which is orthogonally polarized (e.g., polarized at a right angle) with respect to the linearly polarized light produced by light source 110. As another example, the lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

With continued reference to FIG. 1, the output beam 125 and input beam 135 may be substantially coaxial. In other words, the output beam 125 and input beam 135 may at least partially overlap or share a common propagation axis, so that the input beam 135 and the output beam 125 travel along substantially the same optical path (albeit in opposite directions). As the lidar system 100 scans the output beam 125 across a field of regard, the input beam 135 may follow along with the output beam 125, so that the coaxial relationship between the two beams is maintained.

The lidar system 100 also may include one or more optical components configured to condition, shape, filter, modify, steer, or direct the output beam 125 and/or the input beam 135. For example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In some implementations, lidar system 100 includes a telescope, one or more lenses, or one or more mirrors to expand, focus, or collimate the output beam 125 to a desired beam diameter or divergence. As an example, the lidar system 100 may include one or more lenses to focus the input beam 135 onto an active region of the receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include the mirror 115, which may be a metallic or dielectric mirror. The mirror 115 may be configured so that the light beam 125 passes through the mirror 115. As an example, mirror 115 may include a hole, slot, or aperture through which the output light beam 125 passes. As another example, the mirror 115 may be configured so that at least 80% of the output beam 125 passes through the mirror 115 and at least 80% of the input beam 135 is reflected by the mirror 115. In some implementations, the mirror 115 may provide for the output beam 125 and the input beam 135 to be substantially coaxial, so that the beams 125 and 135 travel along substantially the same optical path, in opposite directions.

Generally speaking, the scanner 120 steers the output beam 125 in one or more directions downrange. The scanner 120 may include one or more scanning mirrors and one or more actuators driving the mirrors to rotate, tilt, pivot, or move the mirrors in an angular manner about one or more axes, for example. For example, the first mirror of the scanner may scan the output beam 125 along a first direction, and the second mirror may scan the output beam 125 along a second direction that is substantially orthogonal to the first direction. Example implementations of the scanner 120 are discussed in more detail below with reference to FIG. 2.

The scanner 120 may be configured to scan the output beam 125 over a 5-degree angular range, 20-degree angular range, 30-degree angular range, 60-degree angular range, or any other suitable angular range. For example, a scanning mirror may be configured to periodically rotate over a 15-degree range, which results in the output beam 125 scanning across a 30-degree range (e.g., a 0-degree rotation by a scanning mirror results in a 20-degree angular scan of the output beam 125). A field of regard (FOR) of the lidar system 100 may refer to an area, region, or angular range over which the lidar system 100 may be configured to scan or capture distance information. When the lidar system 100 scans the output beam 125 within a 30-degree scanning range, the lidar system 100 may be referred to as having a 30-degree angular field of regard. As another example, a lidar system 100 with a scanning mirror that rotates over a 30-degree range may produce the output beam 125 that scans across a 60-degree range (e.g., a 60-degree FOR). In various implementations, the lidar system 100 may have a FOR of approximately 10°, 20°, 40°, 60°, 120°, or any other suitable FOR. The FOR also may be referred to as a scan region.

The scanner 120 may be configured to scan the output beam 125 horizontally and vertically, and the lidar system 100 may have a particular FOR along the horizontal direction and another particular FOR along the vertical direction. For example, the lidar system 100 may have a horizontal FOR of 10° to 120° and a vertical FOR of 2° to 45°.

The one or more scanning mirrors of the scanner 120 may be communicatively coupled to the controller 150 which may control the scanning mirror(s) so as to guide the output beam 125 in a desired direction downrange or along a desired scan pattern. In general, a scan pattern may refer to a pattern or path along which the output beam 125 is directed, and also may be referred to as an optical scan pattern, optical scan path, or scan path. As an example, the scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. The lidar system 100 can use the scan path to generate a point cloud with pixels that substantially cover the 60°×20° FOR. The pixels may be approximately evenly distributed across the 60°×20° FOR. Alternately, the pixels may have a particular non-uniform distribution (e.g., the pixels may be distributed across all or a portion of the 60°×20° FOR, and the pixels may have a higher density in one or more particular regions of the 60°×20° FOR).

In operation, the light source 110 may emit pulses of light which the scanner 120 scans across a FOR of lidar system 100. The target 130 may scatter one or more of the emitted pulses, and the receiver 140 may detect at least a portion of the pulses of light scattered by the target 130.

The receiver 140 may be referred to as (or may include) a photoreceiver, optical receiver, optical sensor, detector, photodetector, or optical detector. The receiver 140 in some implementations receives or detects at least a portion of the input beam 135 and produces an electrical signal that corresponds to the input beam 135. For example, if the input beam 135 includes an optical pulse, then the receiver 140 may produce an electrical current or voltage pulse that corresponds to the optical pulse detected by the receiver 140. In an example implementation, the receiver 140 includes one or more avalanche photodiodes (APDs) or one or more single-photon avalanche diodes (SPADs). In another implementation, the receiver 140 includes one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions).

The receiver 140 may have an active region or an avalanche-multiplication region that includes silicon, germanium, or InGaAs. The active region of receiver 140 may have any suitable size, such as for example, a diameter or width of approximately 50-500 µm. The receiver 140 may include circuitry that performs signal amplification, sampling, filtering, signal conditioning, analog-to-digital conversion, time-to-digital conversion, pulse detection, threshold detection, rising-edge detection, or falling-edge detection. For example, the receiver 140 may include a transimpedance amplifier that converts a received photocurrent (e.g., a current produced by an APD in response to a received optical signal) into a voltage signal. The receiver 140 may direct the voltage signal to pulse-detection circuitry that produces an analog or digital output signal 145 that corresponds to one or more characteristics (e.g., rising edge, falling edge, amplitude, or duration) of a received optical pulse. For example, the pulse-detection circuitry may perform a time-to-digital conversion to produce a digital output signal 145. The receiver 140 may send the electrical output signal 145 to the controller 150 for processing or analysis, e.g., to determine a time-of-flight value corresponding to a received optical pulse.

The controller 150 may be electrically coupled or otherwise communicatively coupled to one or more of the light source 110, the scanner 120, and the receiver 140. The controller 150 may receive electrical trigger pulses or edges from the light source 110, where each pulse or edge corresponds to the emission of an optical pulse by the light source 110. The controller 150 may provide instructions, a control signal, or a trigger signal to the light source 110 indicating when the light source 110 should produce optical pulses. For example, the controller 150 may send an electrical trigger signal that includes electrical pulses, where the light source 110 emits an optical pulse in response to each electrical pulse. Further, the controller 150 may cause the light source 110 to adjust one or more of the frequency, period, duration, pulse energy, peak power, average power, or wavelength of the optical pulses produced by light source 110.

The controller 150 may determine a time-of-flight value for an optical pulse based on timing information associated with when the pulse was emitted by light source 110 and when a portion of the pulse (e.g., the input beam 135) was detected or received by the receiver 140. The controller 150 may include circuitry that performs signal amplification, sampling, filtering, signal conditioning, analog-to-digital conversion, time-to-digital conversion, pulse detection, threshold detection, rising-edge detection, or falling-edge detection.

As indicated above, the lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. For example, a depth map may cover a field of regard that extends 60° horizontally and 15° vertically, and the depth map may include a frame of 100-2000 pixels in the horizontal direction by 4-400 pixels in the vertical direction.

The lidar system 100 may be configured to repeatedly capture or generate point clouds of a field of regard at any suitable frame rate between approximately 0.1 frames per second (FPS) and approximately 1,000 FPS. For example, the lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. In an example implementation, the lidar system 100 is configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). The point-cloud frame rate may be substantially fixed or dynamically adjustable, depending on the implementation. For example, the lidar system 100 may capture one or more point clouds at a particular frame rate (e.g., 1 Hz) and then switch to capture one or more point clouds at a different frame rate (e.g., 10 Hz). In general, the lidar system can use a slower frame rate (e.g., 1 Hz) to capture one or more high-resolution point clouds, and use a faster frame rate (e.g., 10 Hz) to rapidly capture multiple lower-resolution point clouds.

The field of regard of the lidar system 100 can overlap, encompass, or enclose at least a portion of the target 130, which may include all or part of an object that is moving or stationary relative to lidar system 100. For example, the target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

Figure 2:
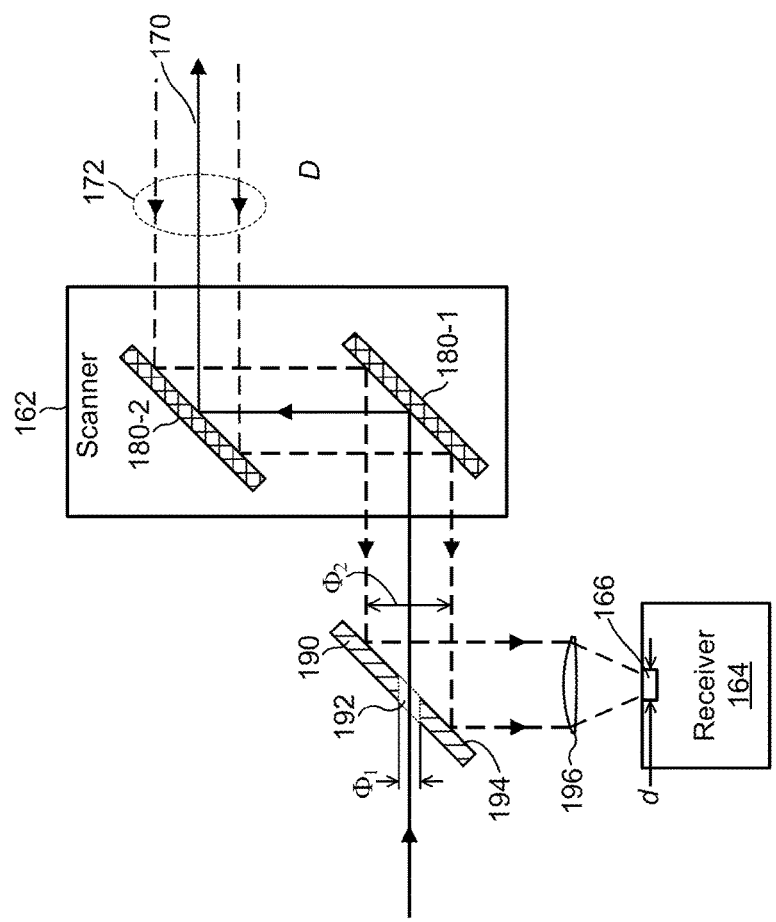
FIG. 2 illustrates in more detail several components that can operate in the system of FIG. 1.

Now referring to FIG. 2, a scanner 162 and a receiver 164 can operate in the lidar system of FIG. 1 as the scanner 120 and the receiver 140, respectively. More generally, the scanner 162 and the receiver 164 can operate in any suitable lidar system.

The scanner 162 may include any suitable number of mirrors driven by any suitable number of mechanical actuators. For example, the scanner 162 may include a galvanometer scanner, a resonant scanner, a piezoelectric actuator, a polygonal scanner, a rotating-prism scanner, a voice coil motor, a DC motor, a brushless DC motor, a stepper motor, or a microelectromechanical systems (MEMS) device, or any other suitable actuator or mechanism.

A galvanometer scanner (which also may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate.

In an example implementation, the scanner 162 includes a single mirror configured to scan an output beam 170 along a single direction (e.g., the scanner 162 may be a one-dimensional scanner that scans along a horizontal or vertical direction). The mirror may be a flat scanning mirror attached to a scanner actuator or mechanism which scans the mirror over a particular angular range. The mirror may be driven by one actuator (e.g., a galvanometer) or two actuators configured to drive the mirror in a push-pull configuration. When two actuators drive the mirror in one direction in a push-pull configuration, the actuators may be located at opposite ends or sides of the mirror. The actuators may operate in a cooperative manner so that when one actuator pushes on the mirror, the other actuator pulls on the mirror, and vice versa. In another example implementation, two voice coil actuators arranged in a push-pull configuration drive a mirror along a horizontal or vertical direction.

In some implementations, the scanner 162 may include one mirror configured to be scanned along two axes, where two actuators arranged in a push-pull configuration provide motion along each axis. For example, two resonant actuators arranged in a horizontal push-pull configuration may drive the mirror along a horizontal direction, and another pair of resonant actuators arranged in a vertical push-pull configuration may drive mirror along a vertical direction. In another example implementation, two actuators scan the output beam 170 along two directions (e.g., horizontal and vertical), where each actuator provides rotational motion along a particular direction or about a particular axis.

The scanner 162 also may include one mirror driven by two actuators configured to scan the mirror along two substantially orthogonal directions. For example, a resonant actuator or a galvanometer actuator may drive one mirror along a substantially horizontal direction, and a galvanometer actuator may drive the mirror along a substantially vertical direction. As another example, two resonant actuators may drive a mirror along two substantially orthogonal directions.

In some implementations, the scanner 162 includes two mirrors, where one mirror scans the output beam 170 along a substantially horizontal direction and the other mirror scans the output beam 170 along a substantially vertical direction. In the example of FIG. 2, the scanner 162 includes two mirrors, a mirror 180-1 and a mirror 180-2. The mirror 180-1 may scan the output beam 170 along a substantially horizontal direction, and the mirror 180-2 may scan the output beam 170 along a substantially vertical direction (or vice versa). Mirror 180-1 or mirror 180-2 may be a flat mirror, a curved mirror, or a polygon mirror with two or more reflective surfaces.

The scanner 162 in other implementations includes two galvanometer scanners driving respective mirrors. For example, the scanner 162 may include a galvanometer actuator that scans the mirror 180-1 along a first direction (e.g., vertical), and the scanner 162 may include another galvanometer actuator that scans the mirror 180-2 along a second direction (e.g., horizontal). In yet another implementation, the scanner 162 includes two mirrors, where a galvanometer actuator drives one mirror, and a resonant actuator drives the other mirror. For example, a galvanometer actuator may scan the mirror 180-1 along a first direction, and a resonant actuator may scan the mirror 180-2 along a second direction. The first and second scanning directions may be substantially orthogonal to one another, e.g., the first direction may be substantially vertical, and the second direction may be substantially horizontal. In yet another implementation, the scanner 162 includes two mirrors, where one mirror is a polygon mirror that is rotated in one direction (e.g., clockwise or counter-clockwise) by an electric motor (e.g., a brushless DC motor). For example, mirror 180-1 may be a polygon mirror that scans the output beam 170 along a substantially horizontal direction, and mirror 180-2 may scan the output beam 170 along a substantially vertical direction. A polygon mirror may have two or more reflective surfaces, and the polygon mirror may be continuously rotated in one direction so that the output beam 170 is reflected sequentially from each of the reflective surfaces. A polygon mirror may have a cross-sectional shape that corresponds to a polygon, where each side of the polygon has a reflective surface. For example, a polygon mirror with a square cross-sectional shape may have four reflective surfaces, and a polygon mirror with a pentagonal cross-sectional shape may have five reflective surfaces.

To direct the output beam 170 along a particular scan pattern, the scanner 162 may include two or more actuators driving a single mirror synchronously. For example, the two or more actuators can drive the mirror synchronously along two substantially orthogonal directions to make the output beam 170 follow a scan pattern with substantially straight lines. In some implementations, the scanner 162 may include two mirrors and actuators driving the two mirrors synchronously to generate a scan pattern that includes substantially straight lines. For example, a galvanometer actuator may drive the mirror 180-2 with a substantially linear back-and-forth motion (e.g., the galvanometer may be driven with a substantially sinusoidal or triangle-shaped waveform) that causes the output beam 170 to trace a substantially horizontal back-and-forth pattern, and another galvanometer actuator may scan the mirror 180-1 along a substantially vertical direction. The two galvanometers may be synchronized so that for every 64 horizontal traces, the output beam 170 makes a single trace along a vertical direction. Whether one or two mirrors are used, the substantially straight lines can be directed substantially horizontally, vertically, or along any other suitable direction.

The scanner 162 also may apply a dynamically adjusted deflection along a vertical direction (e.g., with a galvanometer actuator) as the output beam 170 is scanned along a substantially horizontal direction (e.g., with a galvanometer or resonant actuator) to achieve the straight lines. If a vertical deflection is not applied, the output beam 170 may trace out a curved path as it scans from side to side. In some implementations, the scanner 162 uses a vertical actuator to apply a dynamically adjusted vertical deflection as the output beam 170 is scanned horizontally as well as a discrete vertical offset between each horizontal scan (e.g., to step the output beam 170 to a subsequent row of a scan pattern).

With continued reference to FIG. 2, an overlap mirror 190 in this example implementation is configured to overlap the input beam 172 and output beam 170, so that the beams 170 and 172 are substantially coaxial. In FIG. 2, the overlap mirror 190 includes a hole, slot, or aperture 192 through which the output beam 170 passes, and a reflecting surface 194 that reflects at least a portion of the input beam 172 toward the receiver 164. The overlap mirror 190 may be oriented so that input beam 172 and output beam 170 are at least partially overlapped.

In some implementations, the overlap mirror 190 may not include a hole 192. For example, the output beam 170 may be directed to pass by a side of mirror 190 rather than passing through an aperture 192. The output beam 170 may pass alongside mirror 190 and may be oriented at a slight angle with respect to the orientation of the input beam 172. As another example, the overlap mirror 190 may include a small reflective section configured to reflect the output beam 170, and the rest of the overlap mirror 190 may have an AR coating configured to transmit the input beam 172.

The input beam 172 may pass through a lens 196 which focuses the beam onto an active region 166 of the receiver 164. The active region 166 may refer to an area over which receiver 164 may receive or detect input light. The active region may have any suitable size or diameter d, such as for example, a diameter of approximately 25 μm, 50 μm, 80 μm, 100 μm, 200 μm, 500 μm, 1 mm, 2 mm, or 5 mm. The overlap mirror 190 may have a reflecting surface 194 that is substantially flat or the reflecting surface 194 may be curved (e.g., the mirror 190 may be an off-axis parabolic mirror configured to focus the input beam 172 onto an active region of the receiver 140).

The aperture 192 may have any suitable size or diameter $\Phi_1$, and the input beam 172 may have any suitable size or diameter $\Phi_2$, where $\Phi_2$ is greater than $\Phi_1$. For example, the aperture 192 may have a diameter $\Phi_1$ of approximately 0.2 mm, 0.5 mm, 1 mm, 2 mm, 3 mm, 5 mm, or 10 mm, and the input beam 172 may have a diameter $\Phi_2$ of approximately 2 mm, 5 mm, 10 mm, 15 mm, 20 mm, 30 mm, 40 mm, or 50 mm. In some implementations, the reflective surface 194 of the overlap mirror 190 may reflect 70% or more of input beam 172 toward the receiver 164. For example, if the reflective surface 194 has a reflectivity R at an operating wavelength of the light source 160, then the fraction of input beam 172 directed toward the receiver 164 may be expressed as $R \times [1-(\Phi_1/\Phi_2)^2]$. As a more specific example, if R is 95%, $\Phi_1$ is 2 mm, and $\Phi_2$ is 10 mm, then approximately 91% of the input beam 172 may be directed toward the receiver 164 by the reflective surface 194.

Figure 3:
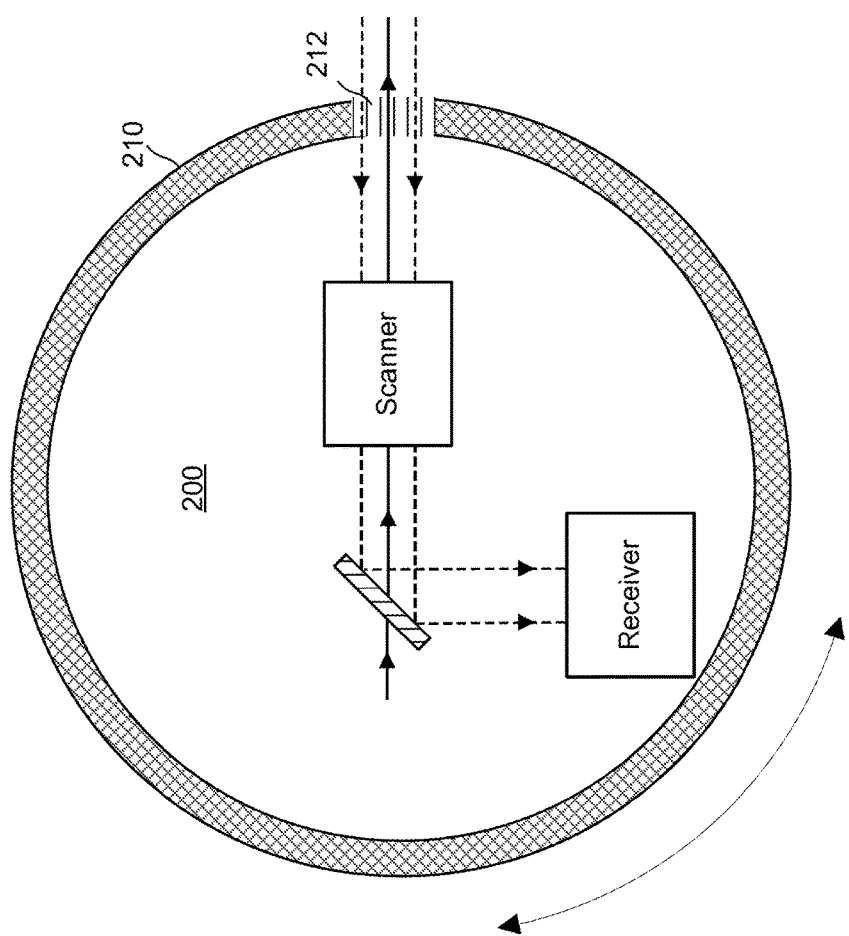
FIG. 3 illustrates an example configuration in which the components of FIG. 1 scan a 360-degree field of regard through a window in a rotating housing.

FIG. 3 illustrates an example configuration in which several components of the lidar system 100 may operate to scan a 360-degree view of regard. Generally speaking, the field of view of a light source in this configuration follows a circular trajectory and accordingly defines a circular scan pattern on a two-dimensional plane. All points on the trajectory remain at the same elevation relative to the ground level, according to one implementation. In this case, separate beams may follow the circular trajectory with certain vertical offsets relative to each other. In another implementation, the points of the trajectory may define a spiral scan pattern in three-dimensional space. A single beam can be sufficient to trace out the spiral scan pattern but, if desired, multiple beams can be used.

In the example of FIG. 3, a rotating scan module 200 revolves around a central axis in one or both directions as indicated. An electric motor may drive the rotating scan module 200 around the central axis at a constant speed, for example. The rotating scan module 200 includes a scanner, a receiver, an overlap mirror, etc. The components of the rotating module 200 may be similar to the scanner 120, the receiver 140, and the overlap mirror 115. In some implementations, the subsystem 200 also includes a light source and a controller. In other implementations, the light source and/or the controller are disposed apart from the rotating scan module 200 and/or exchange optical and electrical signals with the components of the rotating scan module 200 via corresponding links.

The rotating scan module 200 may include a housing 210 with a window 212. Similar to the window 157 of FIG. 1, the window 212 may be made of glass, plastic, or any other suitable material. The window 212 allows outbound beams as well as return signals to pass through the housing 210. The arc length defined by the window 212 can correspond to any suitable percentage of the circumference of the housing 210. For example, the arc length can correspond to 5%, 20%, 30%, 60%, or possibly even 100% of the circumference.

Figure 4:
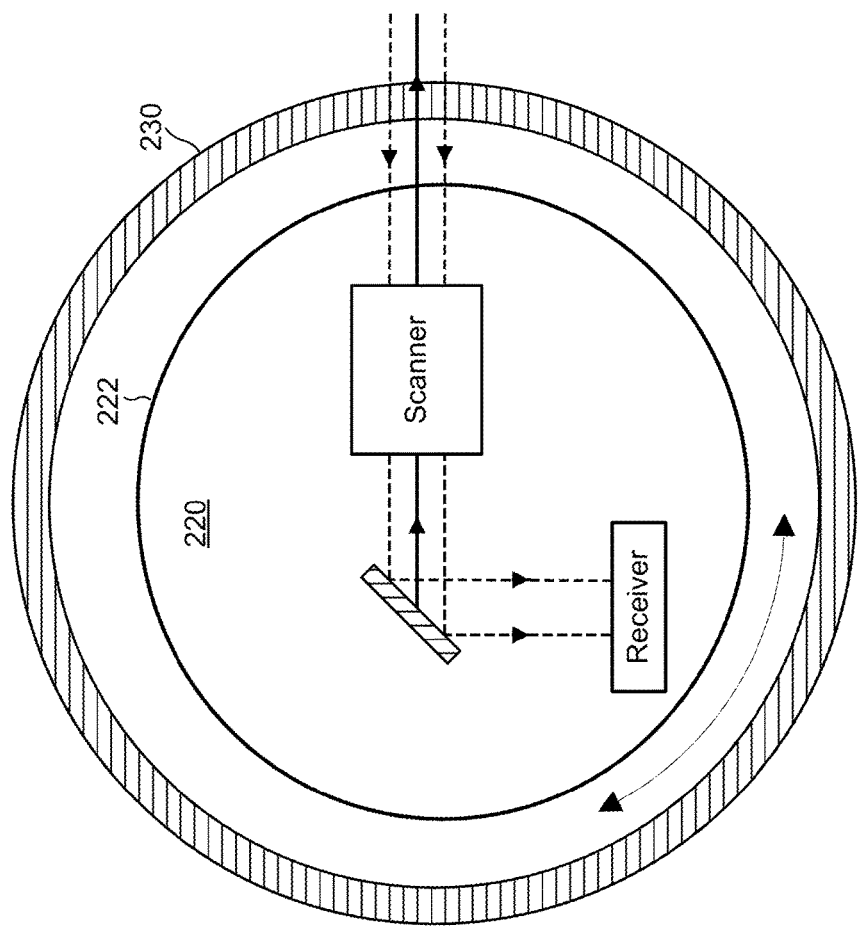
FIG. 4 illustrates another configuration in which the components of FIG. 1 scan a 360-degree field of regard through a substantially transparent stationary housing.

Now referring to FIG. 4, a rotating scan module 220 is generally similar to the rotating scan module 200. In this implementation, however, the components of the rotating scan module 220 are disposed on a platform 222 which rotates inside a stationary circular housing 230. In this implementation, the circular housing 230 is substantially transparent to light at the lidar-system operating wavelength to pass inbound and outbound light signals. The circular housing 230 in a sense defines a circular window similar to the window 212, and may be made of similar material.

One type of lidar system 100 is a pulsed lidar system in which the light source 110 emits pulses of light, and the distance to a remote target 130 is determined from the time-of-flight for a pulse of light to travel to the target 130 and back. Another type of lidar system 100 is a frequency-modulated lidar system, which may be referred to as a frequency-modulated continuous-wave (FMCW) lidar system. A FMCW lidar system uses frequency-modulated light to determine the distance to a remote target 130 based on a modulation frequency of the received light (which is scattered from a remote target) relative to the modulation frequency of the emitted light. For example, for a linearly chirped light source (e.g., a frequency modulation that produces a linear change in frequency with time), the larger the frequency difference between the emitted light and the received light, the farther away the target 130 is located. The frequency difference can be determined by mixing the received light with a portion of the emitted light (e.g., by coupling the two beams onto an APD, or coupling analog electrical signals) and measuring the resulting beat frequency. For example, the electrical signal from an APD can be analyzed using a fast Fourier transform (FFT) technique to determine the difference frequency between the emitted light and the received light.

If a linear frequency modulation m (e.g., in units of Hz/s) is applied to a CW laser, then the distance D from the target 130 to the lidar system 100 may be expressed as D=c·Δf/(2m), where c is the speed of light and Δf is the difference in frequency between the transmitted light and the received light. For example, for a linear frequency modulation of $10^{12}$ Hz/s (or, 1 MHz/μs), if a frequency difference of 330 kHz is measured, then the distance to the target is approximately 50 meters. Additionally, a frequency difference of 1.33 MHz corresponds to a target located approximately 200 meters away.

The light source 110 for a FMCW lidar system can be a fiber laser (e.g., a seed laser diode followed by one or more optical amplifiers) or a direct-emitter laser diode. The seed laser diode or the direct-emitter laser diode can be operated in a CW manner (e.g., by driving the laser diode with a substantially constant DC current), and the frequency modulation can be provided by an external modulator (e.g., an electro-optic phase modulator). Alternatively, the frequency modulation can be produced by applying a DC bias current along with a current modulation to the seed laser diode or the direct-emitter laser diode. The current modulation produces a corresponding refractive-index modulation in the laser diode, which results in a frequency modulation of the light emitted by the laser diode. The current-modulation component (and corresponding frequency modulation) can have any suitable frequency or shape (e.g., sinusoidal, triangle-wave, or sawtooth).

Generating Pixels within a Field of Regard

Figure 5:
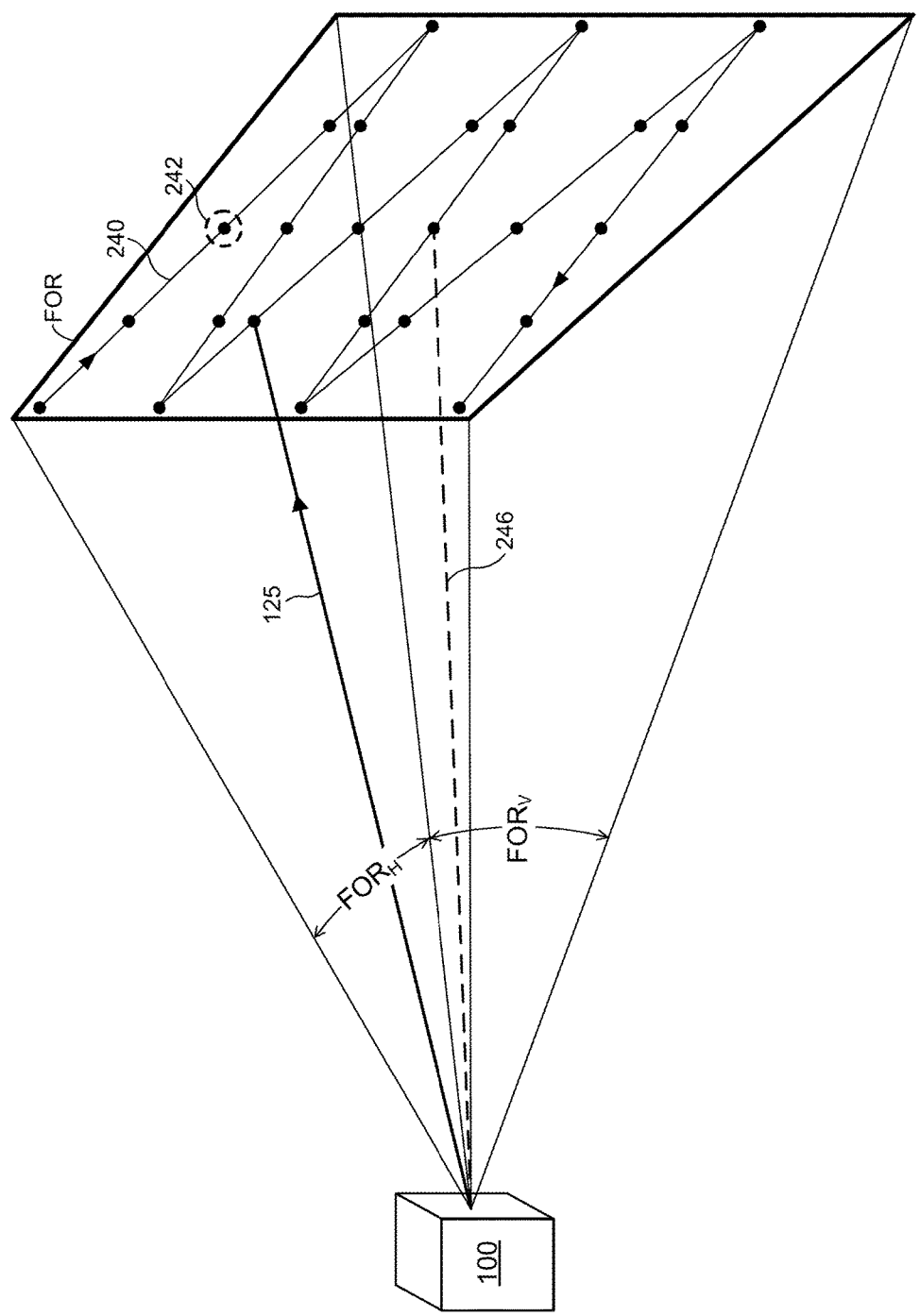
FIG. 5 illustrates an example scan pattern which the lidar system of FIG. 1 can produce when identifying targets within a field of regard.

FIG. 5 illustrates an example scan pattern 240 which the lidar system 100 of FIG. 1 can produce. The lidar system 100 may be configured to scan output optical beam 125 along one or more scan patterns 240. In some implementations, the scan pattern 240 corresponds to a scan across any suitable field of regard (FOR) having any suitable horizontal FOR ($FOR_H$) and any suitable vertical FOR ($FOR_V$). For example, a certain scan pattern may have a field of regard represented by angular dimensions (e.g., $FOR_H \times FOR_V$) 40°×30°, 90°×40°, or 60°×15°. As another example, a certain scan pattern may have a $FOR_H$ greater than or equal to 10°, 25°, 30°, 40°, 60°, 90°, or 120°. As yet another example, a certain scan pattern may have a $FOR_V$ greater than or equal to 2°, 5°, 10°, 15°, 20°, 30°, or 45°. In the example of FIG. 5, reference line 246 represents a center of the field of regard of scan pattern 240. The reference line 246 may have any suitable orientation, such as, a horizontal angle of 0° (e.g., reference line 246 may be oriented straight ahead) and a vertical angle of 0° (e.g., reference line 246 may have an inclination of 0°), or the reference line 246 may have a nonzero horizontal angle or a nonzero inclination (e.g., a vertical angle of +10° or −10°). In FIG. 5, if the scan pattern 240 has a 60°×15° field of regard, then the scan pattern 240 covers a ±30° horizontal range with respect to reference line 246 and a ±7.5° vertical range with respect to reference line 246. Additionally, the optical beam 125 in FIG. 5 has an orientation of approximately −15° horizontal and +3° vertical with respect to reference line 246. The beam 125 may be referred to as having an azimuth of −15° and an altitude of +3° relative to the reference line 246. An azimuth (which may be referred to as an azimuth angle) may represent a horizontal angle with respect to the reference line 246, and an altitude (which may be referred to as an altitude angle, elevation, or elevation angle) may represent a vertical angle with respect to the reference line 246.

The scan pattern 240 may include multiple pixels 242, and each pixel 242 may be associated with one or more laser pulses and one or more corresponding distance measurements. A cycle of scan pattern 240 may include a total of $P_x \times P_y$ pixels 242 (e.g., a two-dimensional distribution of $P_x$ by $P_y$ pixels). For example, the scan pattern 240 may include a distribution with dimensions of approximately 100-2,000 pixels 242 along a horizontal direction and approximately 4-400 pixels 242 along a vertical direction. As another example, the scan pattern 240 may include a distribution of 1,000 pixels 242 along the horizontal direction by 64 pixels 242 along the vertical direction (e.g., the frame size is 1000×64 pixels) for a total of 64,000 pixels per cycle of scan pattern 240. The number of pixels 242 along a horizontal direction may be referred to as a horizontal resolution of the scan pattern 240, and the number of pixels 242 along a vertical direction may be referred to as a vertical resolution of the scan pattern 240. As an example, the scan pattern 240 may have a horizontal resolution of greater than or equal to 100 pixels 242 and a vertical resolution of greater than or equal to 4 pixels 242. As another example, the scan pattern 240 may have a horizontal resolution of 100-2,000 pixels 242 and a vertical resolution of 4-400 pixels 242.

Each pixel 242 may be associated with a distance (e.g., a distance to a portion of a target 130 from which the corresponding laser pulse was scattered) or one or more angular values. As an example, the pixel 242 may be associated with a distance value and two angular values (e.g., an azimuth and altitude) that represent the angular location of the pixel 242 with respect to the lidar system 100. A distance to a portion of the target 130 may be determined based at least in part on a time-of-flight measurement for a corresponding pulse. An angular value (e.g., an azimuth or altitude) may correspond to an angle (e.g., relative to reference line 246) of the output beam 125 (e.g., when a corresponding pulse is emitted from lidar system 100) or an angle of the input beam 135 (e.g., when an input signal is received by lidar system 100). In some implementations, the lidar system 100 determines an angular value based at least in part on a position of a component of the scanner 120. For example, an azimuth or altitude value associated with the pixel 242 may be determined from an angular position of one or more corresponding scanning mirrors of the scanner 120.

In some implementations, the lidar system 100 concurrently directs multiple beams across the field of regard. In the example implementation of FIG. 6, the lidar system generates output beams 250A, 250B, 250C, . . . 250N etc., each of which follows a linear scan pattern 254A, 254B, 254C, . . . 254N. The number of parallel lines can be 2, 4, 12, 20, or any other suitable number. The lidar system 100 may angularly separate the beams 250A, 250B, 250C, . . . 250N, so that, for example, the separation between beams 250A and 250B at a certain distance may be 30 cm, and the separation between the same beams 250A and 250B at a longer distance may be 50 cm.

Figure 6:
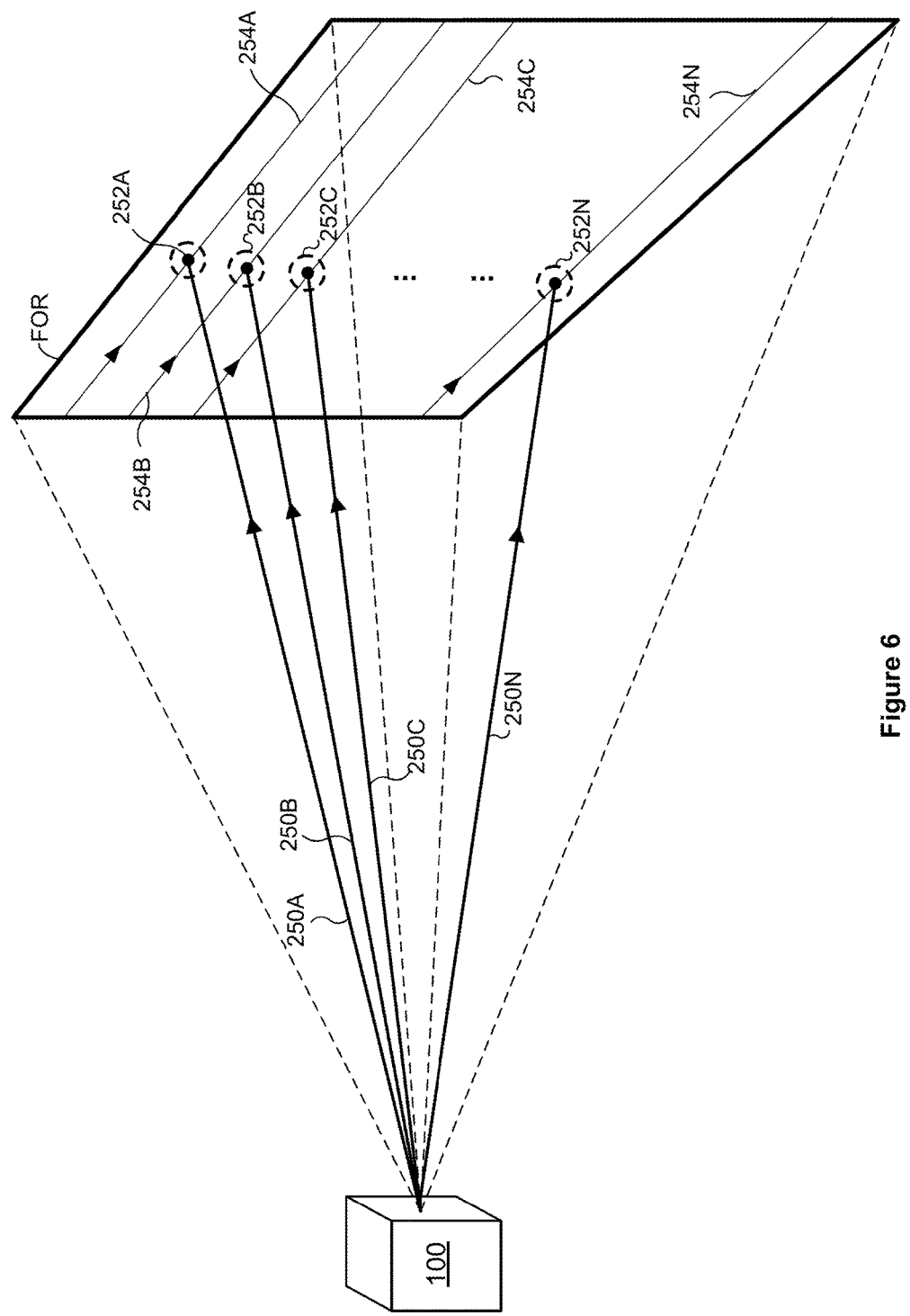
FIG. 6 illustrates an example scan pattern which the lidar system of FIG. 1 can produce when identifying targets within a field of regard using multiple beams.

Similar to the scan pattern 240, each of the linear scan patterns 254A-N includes pixels associated with one or more laser pulses and distance measurements. FIG. 6 illustrates example pixels 252A, 252B and 252C along the scan patterns 254A, 254B and 254C, respectively. The lidar system 100 in this example may generate the values for the pixels 252A-252N at the same time, thus increasing the rate at which values for pixels are determined.

Depending on the implementation, the lidar system 100 may output the beams 250A-N at the same wavelength or different wavelengths. The beam 250A for example may have the wavelength of 1540 nm, the beam 250B may have the wavelength of 1550 nm, the beam 250C may have the wavelength of 1560 nm, etc. The number of different wavelengths the lidar system 100 uses need not match the number of beams. Thus, the lidar system 100 in the example implementation of FIG. 6 may use M wavelengths with N beams, where 1≤M≤N.

Figure 7:
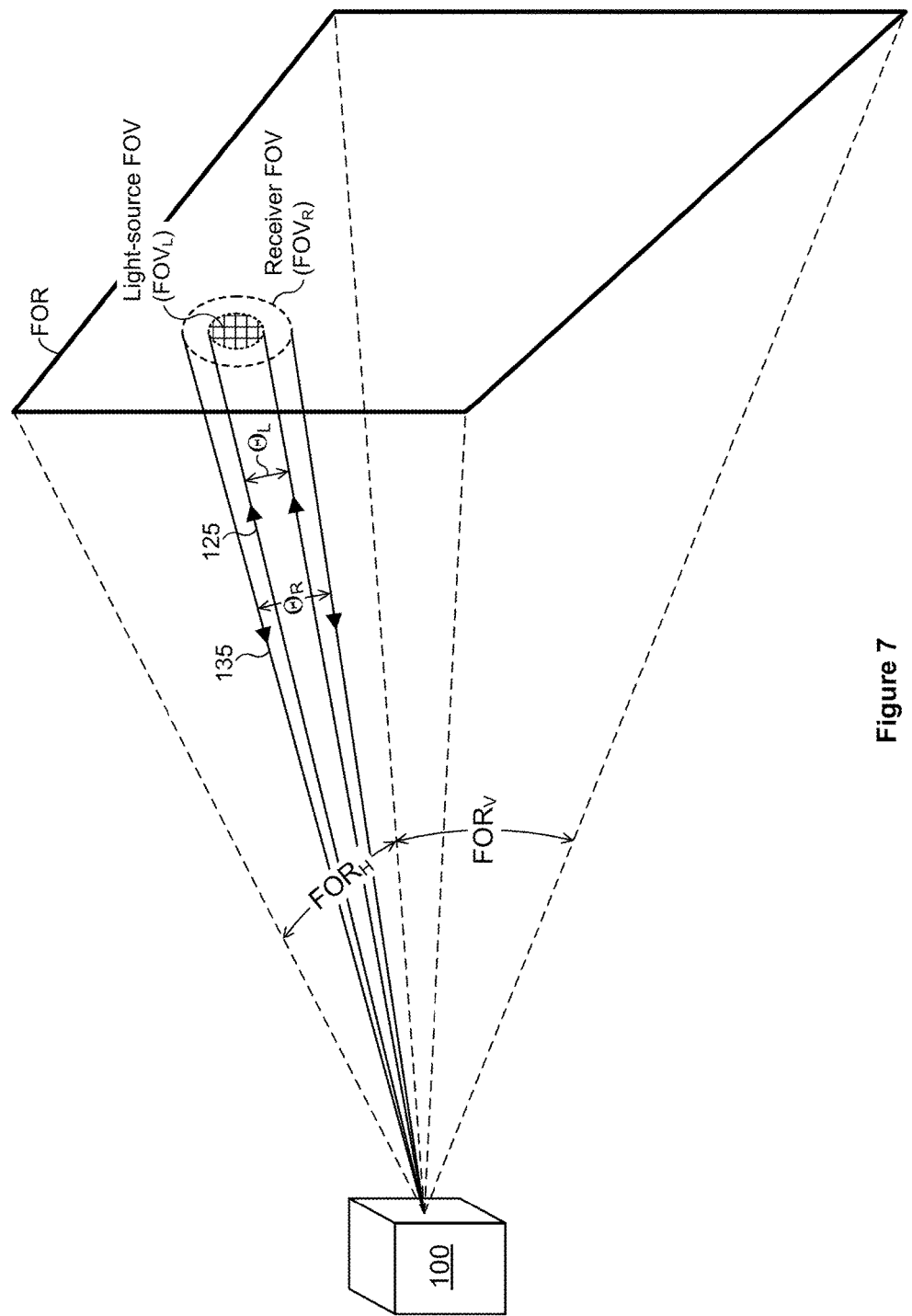
FIG. 7 schematically illustrates fields of view (FOVs) of a light source and a detector that can operate in the lidar system of FIG. 1.

Next, FIG. 7 illustrates an example light-source field of view ($FOV_L$) and receiver field of view ($FOV_R$) for the lidar system 100. The light source 110 may emit pulses of light as the $FOV_L$ and $FOV_R$ are scanned by the scanner 120 across a field of regard (FOR). The light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. For example, as the scanner 120 scans the light-source field of view across a field of regard, the lidar system 100 may send the pulse of light in the direction the $FOV_L$ is pointing at the time the light source 110 emits the pulse. The pulse of light may scatter off the target 130, and the receiver 140 may receive and detect a portion of the scattered light that is directed along or contained within the $FOV_R$.

In some implementations, the scanner 120 is configured to scan both a light-source field of view and a receiver field of view across a field of regard of the lidar system 100. The lidar system 100 may emit and detect multiple pulses of light as the scanner 120 scans the $FOV_L$ and $FOV_R$ across the field of regard while tracing out the scan pattern 240. The scanner 120 in some implementations scans the light-source field of view and the receiver field of view synchronously with respect to one another. In this case, as the scanner 120 scans $FOV_L$ across a scan pattern 240, the $FOV_R$ follows substantially the same path at the same scanning speed. Additionally, the $FOV_L$ and $FOV_R$ may maintain the same relative position to one another as the scanner 120 scans $FOV_L$ and $FOV_R$ across the field of regard. For example, the $FOV_L$ may be substantially overlapped with or centered inside the $FOV_R$ (as illustrated in FIG. 7), and the scanner 120 may maintain this relative positioning between $FOV_L$ and $FOV_R$ throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

The $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. The receiver field of view may be any suitable size relative to the light-source field of view. For example, the receiver field of view may be smaller than, substantially the same size as, or larger than the angular extent of the light-source field of view. In some implementations, the light-source field of view has an angular extent of less than or equal to 50 milliradians, and the receiver field of view has an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. The light-source field of view and the receiver field of view may have approximately equal angular extents. As an example, $\Theta_L$ and $\Theta_R$ may both be approximately equal to 1 mrad, 2 mrad, or 3 mrad. In some implementations, the receiver field of view is larger than the light-source field of view, or the light-source field of view is larger than the receiver field of view. For example, $\Theta_L$ may be approximately equal to 1.5 mrad, and $\Theta_R$ may be approximately equal to 3 mrad.

A pixel 242 may represent or correspond to a light-source field of view. As the output beam 125 propagates from the light source 110, the diameter of the output beam 125 (as well as the size of the corresponding pixel 242) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 242 may also have a corresponding size or diameter of approximately 20 cm. At a distance of 200 m from the lidar system 100, the output beam 125 and the corresponding pixel 242 may each have a diameter of approximately 40 cm.

A Lidar System Operating in a Vehicle

As indicated above, one or more lidar systems 100 may be integrated into a vehicle. In one example implementation, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In some implementations, one or more lidar systems 100 are included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. The lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In some cases, one or more lidar systems 100 are integrated into a vehicle as part of an autonomous-vehicle driving system. In an example implementation, the lidar system 100 provides information about the surrounding environment to a driving system of an autonomous vehicle. An autonomous-vehicle driving system may include one or more computing systems that receive information from the lidar system 100 about the surrounding environment, analyze the received information, and provide control signals to the vehicle's driving systems (e.g., steering wheel, accelerator, brake, or turn signal). For example, the lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if the lidar system 100 detects a vehicle ahead that is slowing down or stopping, the autonomous-vehicle driving system may send instructions to release the accelerator and apply the brakes.

An autonomous vehicle may be referred to as an autonomous car, driverless car, self-driving car, robotic car, or unmanned vehicle. An autonomous vehicle may be a vehicle configured to sense its environment and navigate or drive with little or no human input. For example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

An autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In some implementations, a light source of a lidar system is located remotely from some of the other components of the lidar system such as the scanner and the receiver. Moreover, a lidar system implemented in a vehicle may include fewer light sources than scanners and receivers.

Figure 8:
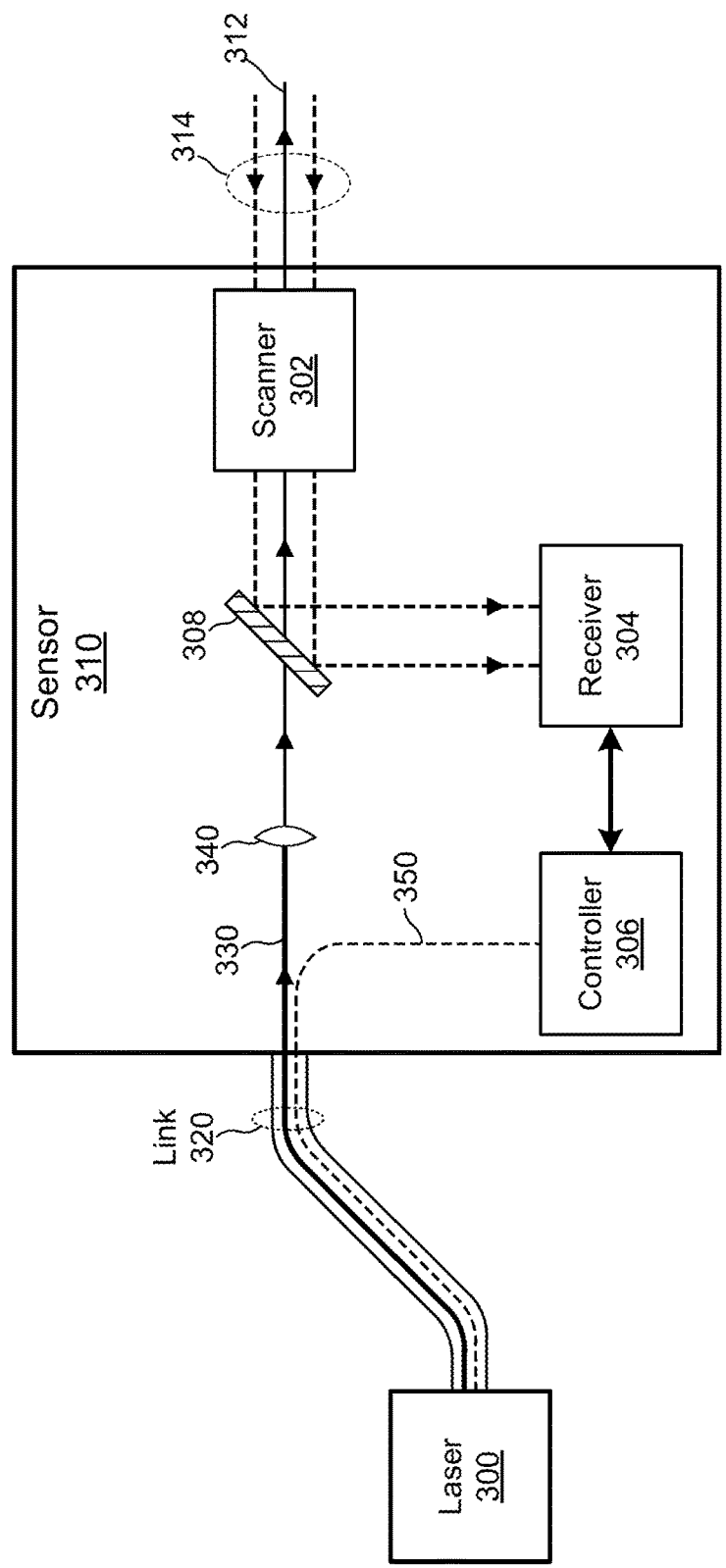
FIG. 8 illustrates an example configuration of the lidar system of FIG. 1 or another suitable lidar system, in which a laser is disposed away from sensor components.

FIG. 8 illustrates an example configuration in which a laser-sensor link 320 includes an optical link 330 and an electrical link 350 coupled between a laser 300 and a sensor 310. The laser 300 may be configured to emit pulses of light and may be referred to as a laser system, laser head, or light source. The laser 300 may include, may be part of, may be similar to, or may be substantially the same as the light source 110 illustrated in FIG. 1 and discussed above. Further, the scanner 302, the receiver 304, the controller 306, and the mirror 308 may be similar to the scanner 120, the receiver 140, the controller 150, and the mirror 115 discussed above. In the example of FIG. 8, the laser 300 is coupled to the remotely located sensor 310 by a laser-sensor link 320 (which may be referred to as a link). The sensor 310 may be referred to as a sensor head and may include the mirror 308, the scanner 302, the receiver 304, and the controller 306. In an example implementation, the laser 300 includes a pulsed laser diode (e.g., a pulsed DFB laser) followed by an optical amplifier, and light from the laser 300 is conveyed by an optical fiber of the laser-sensor link 320 of a suitable length to the scanner 120 in a remotely located sensor 310.

The laser-sensor link 320 may include any suitable number of optical links 330 (e.g., 0, 1, 2, 3, 5, or 10) and any suitable number of electrical links 350 (e.g., 0, 1, 2, 3, 5, or 10). In the example configuration depicted in FIG. 8, the laser-sensor link 320 includes one optical link 330 from the laser 300 to an output collimator 340 and one electrical link 350 that connects the laser 300 to the controller 150. The optical link 330 may include optical fiber (which may be referred to as fiber-optic cable or fiber) that conveys, carries, transports, or transmits light between the laser 300 and the sensor 310. The optical fiber may be, for example, single-mode (SM) fiber, multi-mode (MM) fiber, large-mode-area (LMA) fiber, polarization-maintaining (PM) fiber, photonic-crystal or photonic-bandgap fiber, gain fiber (e.g., rare-earth-doped optical fiber for use in an optical amplifier), or any suitable combination thereof. The output collimator 340 receives optical pulses conveyed from the laser 300 by the optical link 330 and produces a free-space optical beam 312 that includes the optical pulses. The output collimator 340 directs the free-space optical beam 312 through the mirror 308 and to the scanner 302.

The electrical link 350 may include electrical wire or cable (e.g., a coaxial cable or twisted-pair cable) that conveys or transmits electrical power and/or one or more electrical signals between the laser 300 and the sensor 310. For example, the laser 300 may include a power supply or a power conditioner that provides electrical power to the laser 300, and additionally, the power supply or power conditioner may provide power to one or more components of the sensor 310 (e.g., the scanner 304, the receiver 304, and/or the controller 306) via the one or more electrical links 350. The electrical link 350 in some implementations may convey electrical signals that include data or information in analog or digital format. Further, the electrical link 350 may provide an interlock signal from the sensor 310 to the laser 300. If the controller 306 detects a fault condition indicating a problem with the sensor 310 or the overall lidar system, the controller 306 may change a voltage on the interlock line (e.g., from 5 V to 0 V) indicating that the laser 300 should shut down, stop emitting light, or reduce the power or energy of emitted light. A fault condition may be triggered by a failure of the scanner 302, a failure of the receiver 304, or by a person or object coming within a threshold distance of the sensor 310 (e.g., within 0.1 m, 0.5 m, 1 m, 5 m, or any other suitable distance).

As discussed above, a lidar system can include one or more processors to determine a distance D to a target. In the implementation illustrated in FIG. 8, the controller 306 may be located in the laser 300 or in the sensor 310, or parts of the controller 150 may be distributed between the laser 300 and the sensor 310. In an example implementation, each sensor head 310 of a lidar system includes electronics (e.g., an electronic filter, transimpedance amplifier, threshold detector, or time-to-digital (TDC) converter) configured to receive or process a signal from the receiver 304 or from an APD or SPAD of the receiver 304. Additionally, the laser 300 may include processing electronics configured to determine a time-of-flight value or a distance to the target based on a signal received from the sensor head 310 via the electrical link 350.

Figure 9:
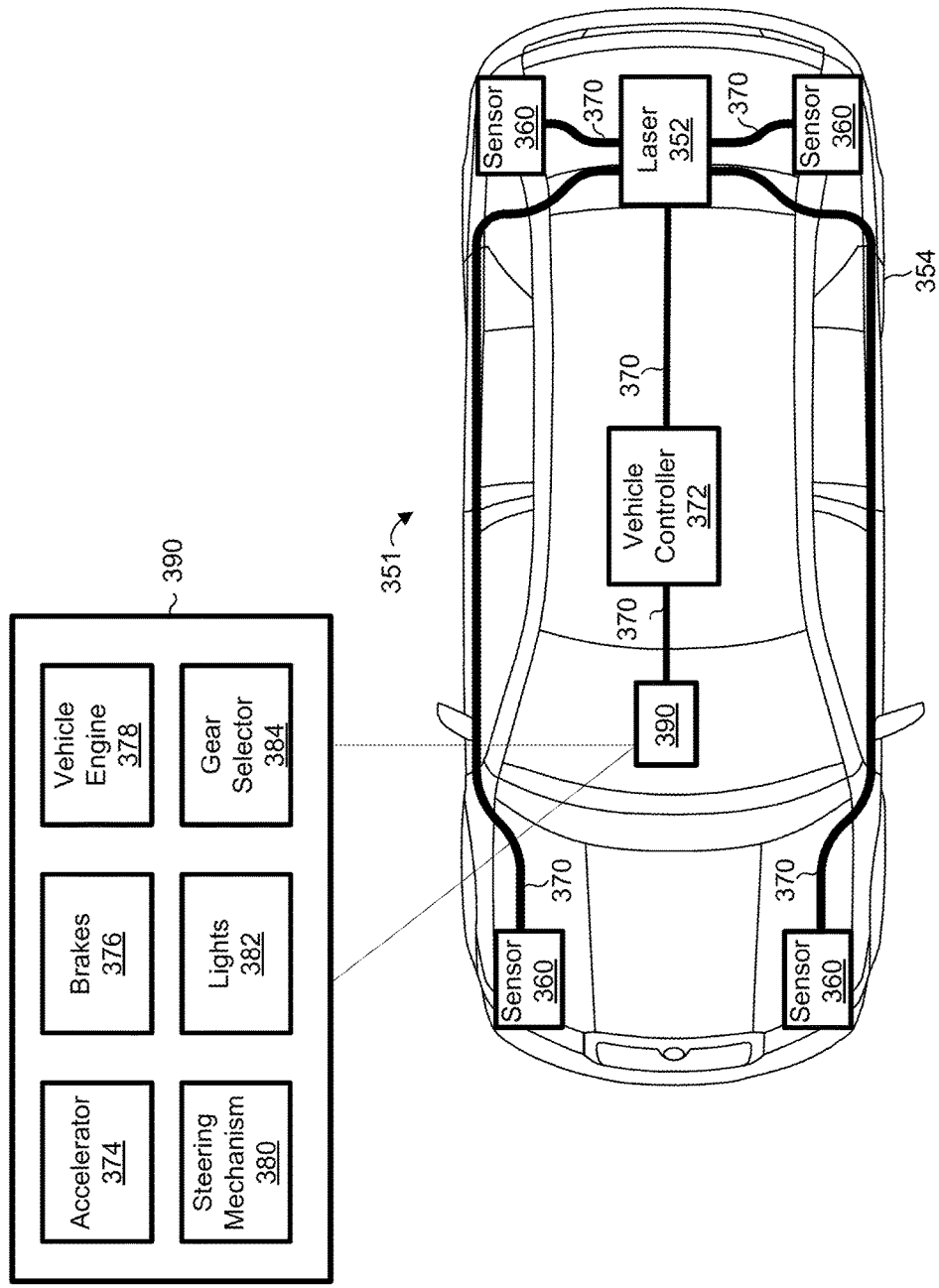
FIG. 9 illustrates an example vehicle in which the lidar system of FIG. 1 can operate.

Next, FIG. 9 illustrates an example vehicle 354 with a lidar system 351 that includes a laser 352 with multiple sensor heads 360 coupled to the laser 352 via multiple laser-sensor links 370. The laser 352 and the sensor heads 360 may be similar to the laser 300 and the sensor 310 discussed above, in some implementations. For example, each of the laser-sensor links 370 may include one or more optical links and/or one or more electrical links. The sensor heads 360 in FIG. 9 are positioned or oriented to provide a greater than 30-degree view of an environment around the vehicle. More generally, a lidar system with multiple sensor heads may provide a horizontal field of regard around a vehicle of approximately 30°, 45°, 60°, 90°, 120°, 180°, 270°, or 360°. Each of the sensor heads may be attached to or incorporated into a bumper, fender, grill, side panel, spoiler, roof, headlight assembly, taillight assembly, rear-view mirror assembly, hood, trunk, window, or any other suitable part of the vehicle.

In the example of FIG. 9, four sensor heads 360 are positioned at or near the four corners of the vehicle (e.g., the sensor heads may be incorporated into a light assembly, side panel, bumper, or fender), and the laser 352 may be located within the vehicle (e.g., in or near the trunk). The four sensor heads 360 may each provide a 90° to 120° horizontal field of regard (FOR), and the four sensor heads 360 may be oriented so that together they provide a complete 360-degree view around the vehicle. As another example, the lidar system 351 may include six sensor heads 360 positioned on or around a vehicle, where each of the sensor heads 360 provides a 60° to 90° horizontal FOR. As another example, the lidar system 351 may include eight sensor heads 360, and each of the sensor heads 360 may provide a 45° to 60° horizontal FOR. As yet another example, the lidar system 351 may include six sensor heads 360, where each of the sensor heads 360 provides a 70° horizontal FOR with an overlap between adjacent FORs of approximately 10°. As another example, the lidar system 351 may include two sensor heads 360 which together provide a horizontal FOR of greater than or equal to 30°.

Data from each of the sensor heads 360 may be combined or stitched together to generate a point cloud that covers a greater than or equal to 30-degree horizontal view around a vehicle. For example, the laser 352 may include a controller or processor that receives data from each of the sensor heads 360 (e.g., via a corresponding electrical link 370) and processes the received data to construct a point cloud covering a 360-degree horizontal view around a vehicle or to determine distances to one or more targets. The point cloud or information from the point cloud may be provided to a vehicle controller 372 via a corresponding electrical, optical, or radio link 370. In some implementations, the point cloud is generated by combining data from each of the multiple sensor heads 360 at a controller included within the laser 352 and provided to the vehicle controller 372. In other implementations, each of the sensor heads 360 includes a controller or process that constructs a point cloud for a portion of the 360-degree horizontal view around the vehicle and provides the respective point cloud to the vehicle controller 372. The vehicle controller 372 then combines or stitches together the points clouds from the respective sensor heads 360 to construct a combined point cloud covering a 360-degree horizontal view. Still further, the vehicle controller 372 in some implementations communicates with a remote server to process point cloud data.

In any event, the vehicle 354 may be an autonomous vehicle where the vehicle controller 372 provides control signals to various components 390 within the vehicle 354 to maneuver and otherwise control operation of the vehicle 354. The components 390 are depicted in an expanded view in FIG. 9 for ease of illustration only. The components 390 may include an accelerator 374, brakes 376, a vehicle engine 378, a steering mechanism 380, lights 382 such as brake lights, head lights, reverse lights, emergency lights, etc., a gear selector 384, and/or other suitable components that effectuate and control movement of the vehicle 354. The gear selector 384 may include the park, reverse, neutral, drive gears, etc. Each of the components 390 may include an interface via which the component receives commands from the vehicle controller 372 such as "increase speed,"

"decrease speed," "turn left 5 degrees," "activate left turn signal," etc. and, in some cases, provides feedback to the vehicle controller 372.

In some implementations, the vehicle controller 372 receives point cloud data from the laser 352 or sensor heads 360 via the link 370 and analyzes the received point cloud data to sense or identify targets 130 and their respective locations, distances, speeds, shapes, sizes, type of target (e.g., vehicle, human, tree, animal), etc. The vehicle controller 372 then provides control signals via the link 370 to the components 390 to control operation of the vehicle based on the analyzed information. For example, the vehicle controller 372 may identify an intersection based on the point cloud data and determine that the intersection is the appropriate location at which to make a left turn. Accordingly, the vehicle controller 372 may provide control signals to the steering mechanism 380, the accelerator 374, and brakes 376 for making a proper left turn. In another example, the vehicle controller 372 may identify a traffic light based on the point cloud data and determine that the vehicle 354 needs to come to a stop. As a result, the vehicle controller 372 may provide control signals to release the accelerator 374 and apply the brakes 376.

Example Receiver Implementation

Figure 10:
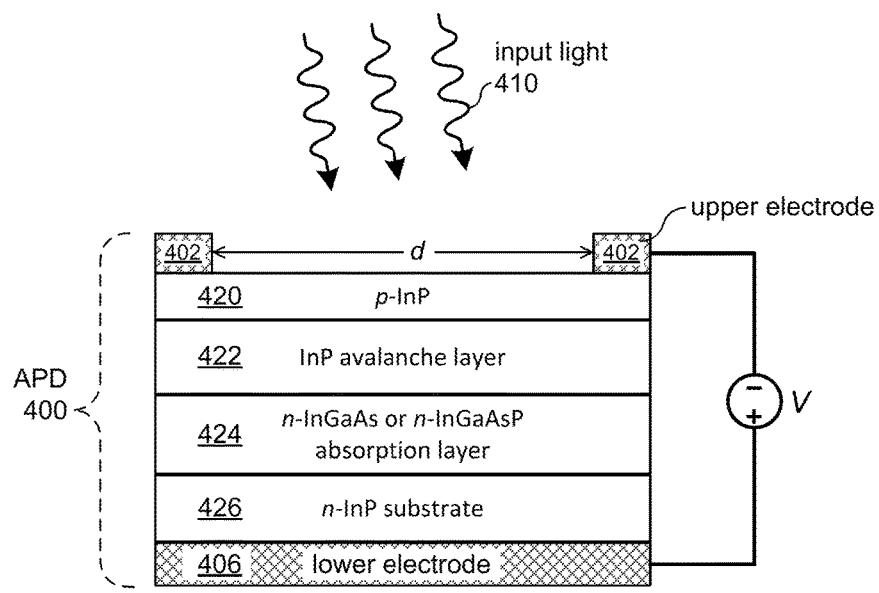
FIG. 10 illustrates an example InGaAs avalanche photodiode which can operate in the lidar system of FIG. 1.

FIG. 10 illustrates an example InGaAs avalanche photodiode (APD) 400. Referring back to FIG. 1, the receiver 140 may include one or more APDs 400 configured to receive and detect light from input light such as the beam 135. More generally, the APD 400 can operate in any suitable receiver of input light. The APD 400 may be configured to detect a portion of pulses of light which are scattered by a target located downrange from the lidar system in which the APD 400 operates. For example, the APD 400 may receive a portion of a pulse of light scattered by the target 130 depicted in FIG. 1, and generate an electrical-current signal corresponding to the received pulse of light.

The APD 400 may include doped or undoped layers of any suitable semiconductor material, such as for example, silicon, germanium, InGaAs, InGaAsP, or indium phosphide (InP). Additionally, the APD 400 may include an upper electrode 402 and a lower electrode 406 for coupling the ADP 400 to an electrical circuit. The APD 400 for example may be electrically coupled to a voltage source that supplies a reverse-bias voltage V to the APD 400. Additionally, the APD 400 may be electrically coupled to a transimpedance amplifier which receives electrical current generated by the APD 400 and produces an output voltage signal that corresponds to the received current. The upper electrode 402 or lower electrode 406 may include any suitable electrically conductive material, such as for example a metal (e.g., gold, copper, silver, or aluminum), a transparent conductive oxide (e.g., indium tin oxide), a carbon-nanotube material, or polysilicon. In some implementations, the upper electrode 402 is partially transparent or has an opening to allow input light 410 to pass through to the active region of the APD 400. In FIG. 10, the upper electrode 402 may have a ring shape that at least partially surrounds the active region of the APD 400, where the active region refers to an area over which the APD 400 may receive and detect the input light 410. The active region may have any suitable size or diameter d, such as for example, a diameter of approximately 25 µm, 50 µm, 80 µm, 100 µm, 200 µm, 500 µm, 1 mm, 2 mm, or 5 mm.

The APD 400 may include any suitable combination of any suitable semiconductor layers having any suitable doping (e.g., n-doped, p-doped, or intrinsic undoped material). In the example of FIG. 10, the InGaAs APD 400 includes a p-doped InP layer 420, an InP avalanche layer 422, an absorption layer 424 with n-doped InGaAs or InGaAsP, and an n-doped InP substrate layer 426. Depending on the implementation, the APD 400 may include separate absorption and avalanche layers, or a single layer may act as both an absorption and avalanche region. The APD 400 may operate electrically as a PN diode or a PIN diode, and, during operation, the APD 400 may be reverse-biased with a positive voltage V applied to the lower electrode 406 with respect to the upper electrode 402. The applied reverse-bias voltage V may have any suitable value, such as for example approximately 5 V, 10 V, 20 V, 30 V, 50 V, 75 V, 100 V, or 200 V.

In FIG. 10, photons of the input light 410 may be absorbed primarily in the absorption layer 424, resulting in the generation of electron-hole pairs (which may be referred to as photo-generated carriers). For example, the absorption layer 424 may be configured to absorb photons corresponding to the operating wavelength of the lidar system 100 (e.g., any suitable wavelength between approximately 1400 nm and approximately 1600 nm). In the avalanche layer 422, an avalanche-multiplication process occurs where carriers (e.g., electrons or holes) generated in the absorption layer 424 collide with the semiconductor lattice of the absorption layer 424, and produce additional carriers through impact ionization. This avalanche process can repeat numerous times so that one photo-generated carrier may result in the generation of multiple carriers. As an example, a single photon absorbed in the absorption layer 424 may lead to the generation of approximately 10, 50, 100, 200, 500, 1000, 10,000, or any other suitable number of carriers through an avalanche-multiplication process. The carriers generated in an APD 400 may produce an electrical current that is coupled to an electrical circuit which may perform signal amplification, sampling, filtering, signal conditioning, analog-to-digital conversion, time-to-digital conversion, pulse detection, threshold detection, rising-edge detection, or falling-edge detection.

The number of carriers generated from a single photo-generated carrier may increase as the applied reverse bias V is increased. If the applied reverse bias V is increased above a particular value referred to as the APD breakdown voltage, then a single carrier can trigger a self-sustaining avalanche process (e.g., the output of the APD 400 is saturated regardless of the input light level). The APD 400 that is operated at or above a breakdown voltage may be referred to as a single-photon avalanche diode (SPAD) and may be referred to as operating in a Geiger mode or a photon-counting mode. The APD 400 that is operated below a breakdown voltage may be referred to as a linear APD, and the output current generated by the APD 400 may be sent to an amplifier circuit (e.g., a transimpedance amplifier). The receiver 140 (see FIG. 1) may include an APD configured to operate as a SPAD and a quenching circuit configured to reduce a reverse-bias voltage applied to the SPAD when an avalanche event occurs in the SPAD. The APD 400 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 400 may be coupled to a circuit that generates an electrical output pulse or edge when an avalanche event occurs.

In some implementations, the APD 400 or the APD 400 along with transimpedance amplifier have a noise-equivalent power (NEP) that is less than or equal to 100 photons, 50 photons, 30 photons, 20 photons, or 10 photons. For example, the APD 400 may be operated as a SPAD and may have a NEP of less than or equal to 20 photons. As another example, the APD 400 may be coupled to a transimpedance amplifier that produces an output voltage signal with a NEP of less than or equal to 50 photons. The NEP of the APD 400 is a metric that quantifies the sensitivity of the APD 400 in terms of a minimum signal (or a minimum number of photons) that the APD 400 can detect. The NEP may correspond to an optical power (or to a number of photons) that results in a signal-to-noise ratio of 1, or the NEP may represent a threshold number of photons above which an optical signal may be detected. For example, if the APD 400 has a NEP of 20 photons, then the input beam 410 with 20 photons may be detected with a signal-to-noise ratio of approximately 1 (e.g., the APD 400 may receive 20 photons from the input beam 410 and generate an electrical signal representing the input beam 410 that has a signal-to-noise ratio of approximately 1). Similarly, the input beam 410 with 100 photons may be detected with a signal-to-noise ratio of approximately 5. In some implementations, the lidar system 100 with the APD 400 (or a combination of the APD 400 and transimpedance amplifier) having a NEP of less than or equal to 100 photons, 50 photons, 30 photons, 20 photons, or 10 photons offers improved detection sensitivity with respect to a conventional lidar system that uses a PN or PIN photodiode. For example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with the InGaAs APD detector 400.

Referring back to FIG. 1, an optical filter may be located in front of the receiver 140 and configured to transmit light at one or more operating wavelengths of the light source 110 and attenuate light at surrounding wavelengths. For example, an optical filter may be a free-space spectral filter located in front of APD 400 of FIG. 10. This spectral filter may transmit light at the operating wavelength of the light source 110 (e.g., between approximately 1530 nm and 1560 nm) and attenuate light outside that wavelength range. As a more specific example, light with wavelengths of approximately 400-1530 nm or 1560-2000 nm may be attenuated by any suitable amount, such as for example, by at least 5 dB, 10 dB, 20 dB, 30 dB, or 40 dB.

Figure 11:
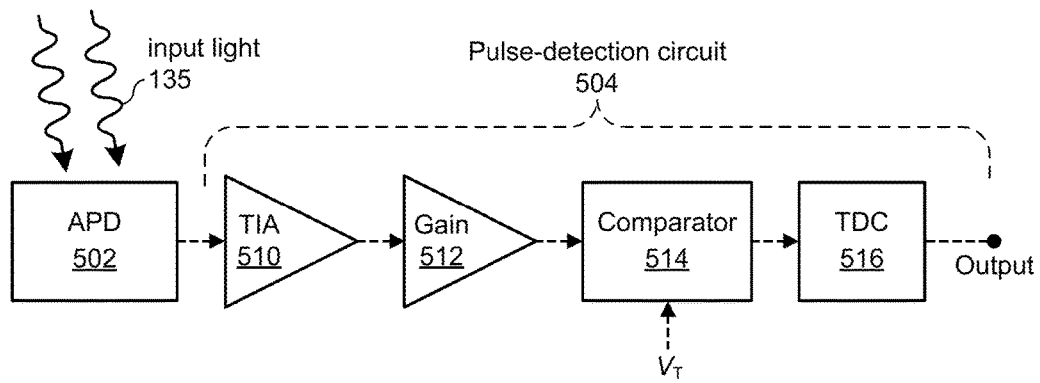
FIG. 11 illustrates an example photodiode coupled to a pulse-detection circuit, which can operate in the lidar system of FIG. 1.

Next, FIG. 11 illustrates an APD 502 coupled to an example pulse-detection circuit 504. The APD 502 can be similar to the APD 400 discussed above with reference to FIG. 10, or can be any other suitable detector. The pulse-detection circuit 504 can operate in the lidar system of FIG. 1 as part of the receiver 140. Further, the pulse-detection circuit 504 can operate in the receiver 164 of FIG. 2, the receiver 304 of FIG. 8, or any other suitable receiver. The pulse-detection circuit 504 alternatively can be implemented in the controller 150, the controller 306, or another suitable controller. In some implementations, parts of the pulse-detection circuit 504 can operate in a receiver and other parts of the pulse-detection circuit 504 can operate in a controller. For example, components 510 and 512 may be a part of the receiver 140, and components 514 and 516 may be a part of the controller 150.

The pulse-detection circuit 504 may include circuitry that receives a signal from a detector (e.g., an electrical current from the APD 502) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 504 may determine whether an optical pulse has been received by the APD 502 or may determine a time associated with receipt of an optical pulse by the APD 502. Additionally, the pulse-detection circuit 504 may determine a duration of a received optical pulse. In an example implementation, the pulse-detection circuit 504 includes a transimpedance amplifier (TIA) 510, a gain circuit 512, a comparator 514, and a time-to-digital converter (TDC) 516.

The TIA 510 may be configured to receive an electrical-current signal from the APD 502 and produce a voltage signal that corresponds to the received electrical-current signal. For example, in response to a received optical pulse, the APD 502 may produce a current pulse corresponding to the optical pulse. The TIA 510 may receive the current pulse from the APD 502 and produce a voltage pulse that corresponds to the received current pulse. The TIA 510 may also act as an electronic filter. For example, the TIA 510 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency).

The gain circuit 512 may be configured to amplify a voltage signal. As an example, the gain circuit 512 may include one or more voltage-amplification stages that amplify a voltage signal received from the TIA 510. For example, the gain circuit 512 may receive a voltage pulse from the TIA 510, and the gain circuit 512 may amplify the voltage pulse by any suitable amount, such as for example, by a gain of approximately 3 dB, 10 dB, 20 dB, 30 dB, 40 dB, or 50 dB. Additionally, the gain circuit 512 may also act as an electronic filter configured to remove or attenuate electrical noise.

The comparator 514 may be configured to receive a voltage signal from the TIA 510 or the gain circuit 512 and produce an electrical-edge signal (e.g., a rising edge or a falling edge) when the received voltage signal rises above or falls below a particular threshold voltage $V_T$. As an example, when a received voltage rises above $V_T$, the comparator 514 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, the comparator 514 may produce a falling-edge digital-voltage signal (e.g., a signal that steps down from approximately 2.5 V, 3.3 V, 5 V, or any other suitable digital-high level to approximately 0 V). The voltage signal received by the comparator 514 may be received from the TIA 510 or the gain circuit 512 and may correspond to an electrical-current signal generated by the APD 502. For example, the voltage signal received by the comparator 514 may include a voltage pulse that corresponds to an electrical-current pulse produced by the APD 502 in response to receiving an optical pulse. The voltage signal received by the comparator 514 may be an analog signal, and an electrical-edge signal produced by the comparator 514 may be a digital signal.

The time-to-digital converter (TDC) 516 may be configured to receive an electrical-edge signal from the comparator 514 and determine an interval of time between emission of a pulse of light by the light source and receipt of the electrical-edge signal. The output of the TDC 516 may be a numerical value that corresponds to the time interval determined by the TDC 516. In some implementations, the TDC 516 has an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. The TDC 516 for example may have an internal counter or clock with a 20 ps period, and the TDC 516 may determine that an interval of time between emission and receipt of a pulse is equal to 25,000 time periods, which corresponds to a time interval of approximately 0.5 microseconds. Referring back to FIG. 1, the TDC 516 may send the numerical value "25000" to a processor or controller 150 of the lidar system 100, which may include a processor configured to determine a distance from the lidar system 100 to the target 130 based at least in part on an interval of time determined by a TDC 516. The processor may receive a numerical value (e.g., "25000") from the TDC 516 and, based on the received value, the processor may determine the distance from the lidar system 100 to a target 130.

Configuring Secondary Optical Signals for Multispectral Sensing with Lidar

As indicated above, a lidar system can use the scanner to collect information in different secondary wavelength ranges to supplement the ranging information collected at the primary wavelength corresponding to the laser of the lidar. Each secondary wavelength range can be represented by a nominal secondary wavelength. The secondary information, collected at the secondary wavelengths, can improve the situational awareness of the platform on which the lidar is operating (e.g., a vehicle). The benefits of using the scanner of the lidar to collect information on secondary wavelengths can include inherent registration of secondary information to the primary range information, reduction of cost in comparison to integration of independent sensing systems, reduction in required computing resources by intelligent data acquisition, etc.

Figure 12:
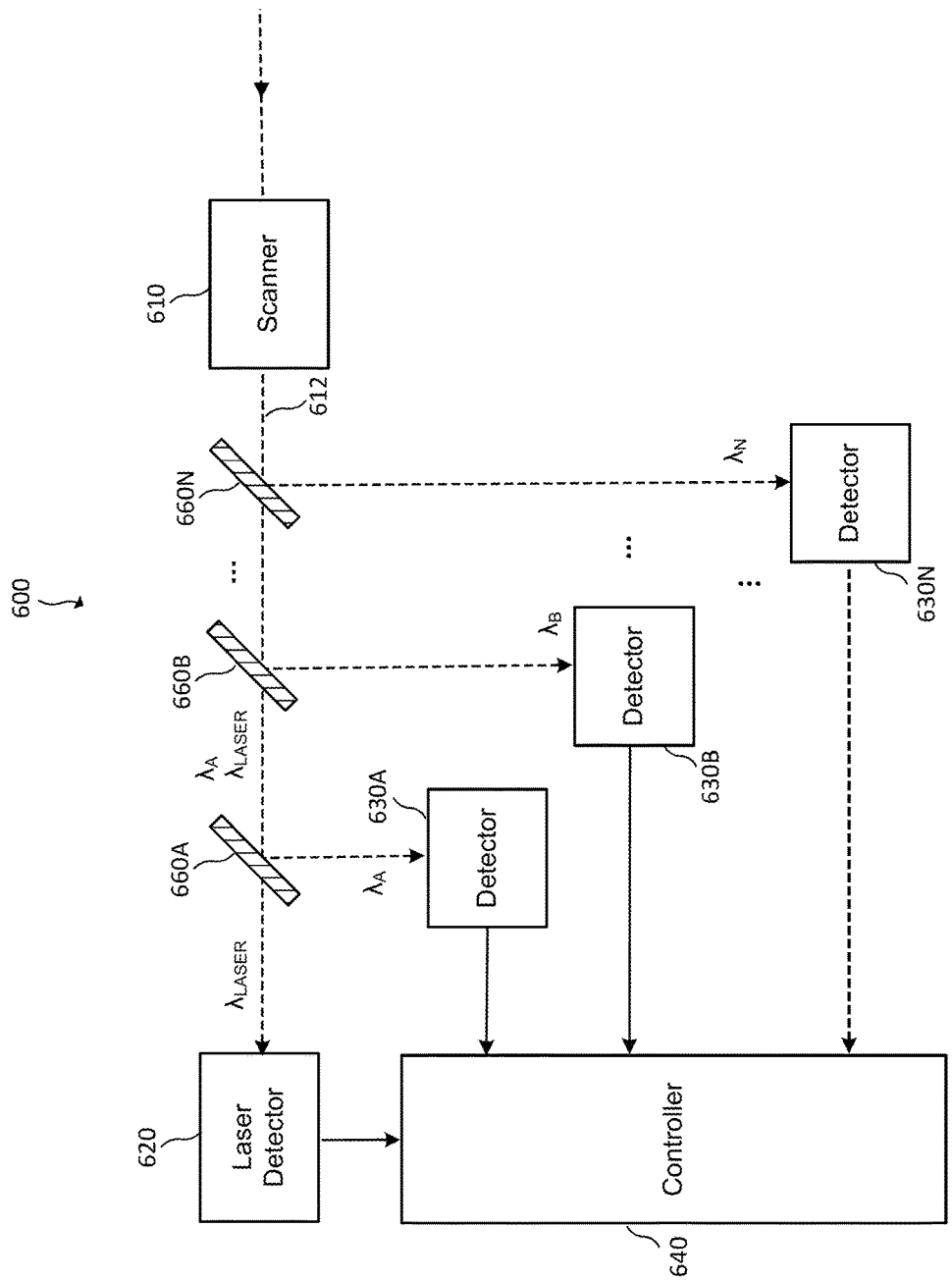
FIG. 12 illustrates an example multispectral lidar system.

FIG. 12 illustrates an example implementation of a multispectral lidar system 600. A light source of the multispectral lidar system 600, not illustrated to reduce clutter, can output a laser beam operating at a certain wavelength $\lambda_{LASER}$, which can be referred to below as the primary wavelength. In operation, the light source emits a pulse of light directed by a scanner 610 toward a remote target. The scanner 610 then directs some of the light scattered by the remote target toward a laser detector 620, which defines the first or primary detector of the multispectral lidar system 600. The scanner 610 can be generally similar to the scanner 120, 162, etc., and the detector 620 can be generally similar to the detector 166 discussed above.

A detector 630A can operate as a secondary wavelength detector and detect light at a corresponding secondary wavelength. The secondary wavelength need not correspond to active sensing, i.e., a light signal emitted by the multispectral lidar system 600. Accordingly, the multispectral lidar system 600 can include any suitable number of secondary wavelength detectors, such as for example a detector 630B configured to detect light at a third wavelength.

The secondary detectors 630A, 630B, etc. can be configured to detect light signals at wavelength ranges that can include, in various implementations, red, green and blue regions of the visible spectrum, near infrared ranges (NIR, 750-1000 nm), short-wave infrared ranges (SWIR, 1-2.5 μm), mid-wave infrared ranges (MWIR, 3-5 μm), or long-wave infrared ranges (LWIR, 8-12 μm).

When used for visible and some of the infrared wavelengths, the secondary detectors 630A, 630B, etc. can include PN, PIN, or avalanche photodiodes made from any suitable semiconductor material such as silicon, germanium, InGaAs, InGaAsP, or indium phosphide. When used for longer wavelength values in the infrared range, the secondary detectors 630A, 630B, etc. may include thermal detectors and/or detector elements such as bolometers, microbolometers, thermopiles, and optoelectronic detectors such as quantum well infrared photodetectors (QWIPs), HgCdTe photodiodes, indium antimonide photodiodes, intersubband detectors, quantum cascade detectors, etc.

The secondary detectors 630A, 630B, etc. detectors contain single detectors or detector arrays (e.g. CCD arrays, CMOS arrays, microbolometer arrays) made of multiple separate detector elements, and may include integrated electronics. In some implementations, these secondary detectors may be integrated with filters, such as color filter arrays, to limit spectral response of individual detectors in an array of detectors.

The controller 640 can determine a distance to the remote target using the light detected by the first detector, generate a measurement of a property of the remote target based on the light detected by the secondary wavelength detector 630A, and modify the generated measurement of the property of the remote target using the determined distance to the remote target. The controller 640 may perform a similar computation for the light detected by the third detector 630B or any other secondary detector. For example, the controller 640 can measure the temperature of the target or the size of the target using the determined distance to the target along with the light detected using the detector 630A.

In the implementation illustrated in FIG. 12, wavelength-selective optical elements 660A, 660B, . . . 660N direct an input beam 612, which includes light scattered or emitted from the target at different secondary wavelengths, toward the corresponding detectors 630A, 630B, . . . 630N. In particular, the optical element 660A splits the input beam 612 into a component that includes light at wavelength $\lambda_{LASER}$ and a component that includes light at wavelength $\lambda_A$, and directs these components toward the detectors 620 and 630A, respectively. The optical element 660A is disposed downrange of the optical element 660B relative to the detectors. Accordingly, the optical element 660B splits the input beam 612 in a first component that includes light at wavelengths $\lambda_{LASER}$ and $\lambda_A$, and a second component that includes light at wavelength $\lambda_B$. The optical element 660B directs the first component toward the optical element 660A and the second component toward the detector 630B. Each of these optical elements may include reflection gratings, transmission gratings, prisms, grisms, other forms of diffractive and/or refractive optics as well as interference filters and/or coatings, etc.

Each of the detectors 620, 630A, 630B, etc. has a corresponding fields of view (FOV) with a certain angular extent. The multispectral lidar system 600 can be configured to allow a target to be simultaneously within the respective FOV of each detector. In other implementations, the target may be within the FOVs of different detectors at different moments of time, during the same ranging event or even different ranging events.

FIGS. 13A-D illustrate several exemplary implementations of a receiver comprising primary and secondary detectors. A receiver 750 of FIG. 13A includes a primary detector 752 on the same plane as a secondary detector 754. A lens 756 directs light to the detectors 752 and 754. In this implementation, the FOV of the primary detector 752 and the FOV of the secondary detector 754 may not overlap at any given moment during a scan. The relationship between these FOVs, however, is known from the geometry and the scanning pattern of the scanner. A controller thus can compute the time at which each of the FOVs will subtend the same target.

In general, the optics for focusing collected light onto detectors can be refractive, such as lenses (in particular, the lens 756) and prisms, or reflective, such as mirrors. To cover a broad range of wavelengths, the refractive optics must use materials with high transmittance at all of the wavelengths of interest. BK7 and fused silica may serve as refractive optics materials for visible light through most of SWIR. The materials that work well for visible light and through MWIR include $CaF_2$ and $MgF_2$. ZnSe is rather transparent from NIR through LWIR, but not in the visible range. ZnS can be a good choice when it is necessary to cover the visible spectrum through LWIR. Even for materials that are transparent at all of the wavelengths of interest, chromatic dispersion can lead to different focal lengths at different wavelengths. In some implementations, the lens 756 can be replaced by multi-element optics to compensate for chromatic dispersion. Alternatively, reflective optics rather than the lens 756 can be used in implementations covering a wide range of wavelengths. The reflective optics can include a parabolic mirror or a system of mirrors.

The diameter of the lens can be 1 cm, 2 cm, 5 cm, or another suitable size, for example. The distance between the plane on which the detectors 752, 754 are disposed and the plane of the lens 756 can be 2 cm, 5 cm, 10 cm, 20 cm or another suitable distance. This distance can approximately correspond to the focal length of the lens 756. The lateral spacing between the centers of neighboring detectors 752 and 754 can range from tens or hundreds of microns to multiple millimeters. When additional secondary detectors are disposed on the same plane as the detectors 752 and 754, the lateral spacing does not need to be consistent throughout the detector region. The later spacing can depend on the packaging of the detectors and the manner in which these detectors are integrated into the detector region. Depending on the implementation, different detectors can be integrated on the same substrate, mounted as a separate semiconductor die on a shared carrier, or surface-mounted onto a printed circuit board (PCB). In at least some of the embodiments, the smallest spacing is achieved between integrated detectors, followed by hybrid integration of die on a carrier, followed by the relatively larger spacing between packaged detectors.

In one example implementation, a die containing an array of photodiodes coated with a color filter array is placed onto a chip carrier next to a die containing an APD for detecting lidar pulses. The chip carrier is then surface-mounted mounted onto a printed circuit board next to a surface-mounted or through-hole mounted bolometer package. The spacing between the photodiodes on the die containing the photodiode array can be 50 µm, while the spacing between the center of the photodiode array and the center of the die containing the APD can be 400 µm. The spacing between the center of the packaged bolometer and the center of the APD can be near 4 mm, due to the size of the bolometer package.

Figure 13A:
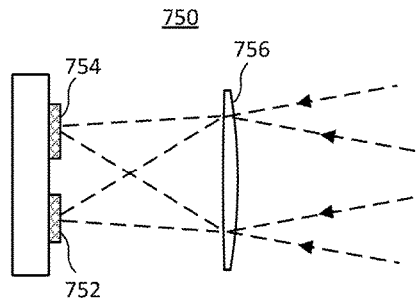
FIG. 13A-D illustrate example implementations of a receiver that can operate in the system of FIG. 12.

With continued reference to FIG. 13A, the lateral spacing between the detectors 752 and 754 results in the difference between the look directions (centers of the IFOVs) or the FOVs. The angular difference in the look direction can be estimated as the lateral separation divided by the focal length. For example, the detector region with the detectors 752, 754 can be separated from the lens 756 by the distance of 10 cm. The look direction of the secondary detector 754 then is approximately 4 mrad or 0.23° away from the look direction of the primary detector 752. In another example implementation, the focal length is approximately 5 cm, and the angular separation between the look directions of the detectors 752, 754 accordingly increases by a factor of two.

Referring back to FIG. 2, if the arrangement illustrated in FIG. 13A is used in place of the detector 166 and the lens 196, the angular difference between look directions and/or FOVs of the detectors 152, 154 can lead to the detectors 152, 154 obtaining information from the same look direction at different times during a scan. Additionally or alternatively, the light scattered and/or radiated from a target at different wavelengths and detected by the primary detector 152 (configured to detect lidar pulses) and secondary detector 154 (configured to detect thermal radiation, for example) may be detected at different times during a scan. These different times may correspond to the times when each detector 152, 154 "sees" at least a part of the target within its FOV.

For clarity, the relationship between the physical arrangement of detectors and the FOVs of different detectors can be illustrated by the following example. A lidar system illustrated in FIG. 5 may scan a 90° FORH and a 15° FORV in 64 horizontal scan lines with 1000 pixels 242 in every line. Each pixel may correspond to a different look direction in the scan. The lidar system may scan the entire field of regard in 0.1 seconds at a uniform rate, so that the time interval between successive points in a horizontal scan is approximately 1.56 µs, while the time between a pixel in one horizontal line and a pixel directly above or below in another horizontal line is 1.56 ms. The angular separation between neighboring horizontal pixels may then be 0.09° while the separation between neighboring vertical pixels may be 0.23°. In one implementation, a secondary detector with a horizontal look direction separation of 2.3° from the primary lidar detector may have a 25.6 µs delay in looking in the same direction as the primary detector. A secondary detector with a vertical look direction separation of 0.23° from the primary lidar may have a 1.56 ms delay in looking in the same direction as the primary detector. A lidar system may associate each pixel from the primary lidar detector with the corresponding data from the secondary detector by processing the collected data along with the known delays between the coincidence of the look directions, where the delays are determined by the scan pattern.

Figure 13B:
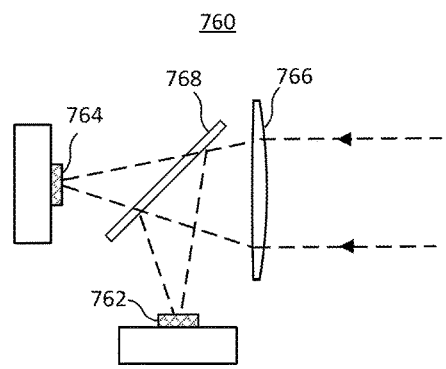

In another implementation illustrated in FIG. 13B, a receiver 760 includes a filter 768 that separates light signals for different wavelengths. The filter 768 can include a dichroic mirror, a dichroic filter, an interference filter, or a thin-film filter, constructed with a multi-layer coating to transmit or reflect different wavelength bands. Additionally or alternatively, receiver 760 can use diffractive optics, such as transmission or reflection gratings, or refractive optics, such as prisms, to separate the light according to wavelength. Further, different kinds of optical elements can be combined in the receiver 760 to achieve wavelength separation. In the implementation of FIG. 13B, the filter 768 is placed between the detectors 762 and 764 and the common focusing element, a lens 766. This configuration allow detectors 762 and 764 to have the same look direction (the axis at the center of the instantaneous FOV) and overlapping FOVs at any point in time during a scan.

Figure 13C:
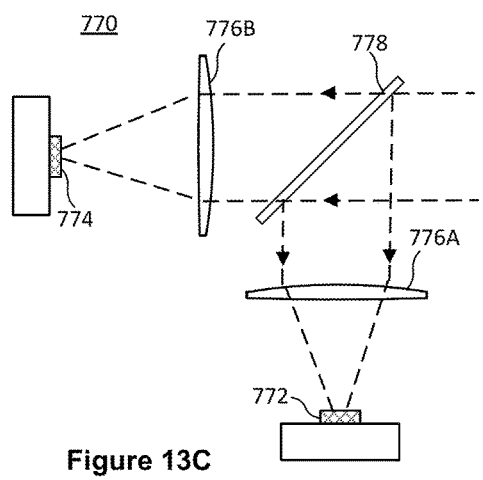

In the implementation of FIG. 13C, a receiver 770 includes a filter 778 placed between the focusing optics 776A, 776B and the mirrors of the scanner (not shown). This implementation may allow the use of dedicated optics 776A, 776B for different wavelengths, which, in turn, may relax the design constraints for the filter 778 and the choice of materials for the optics 776A, 776B.

Figure 13D:
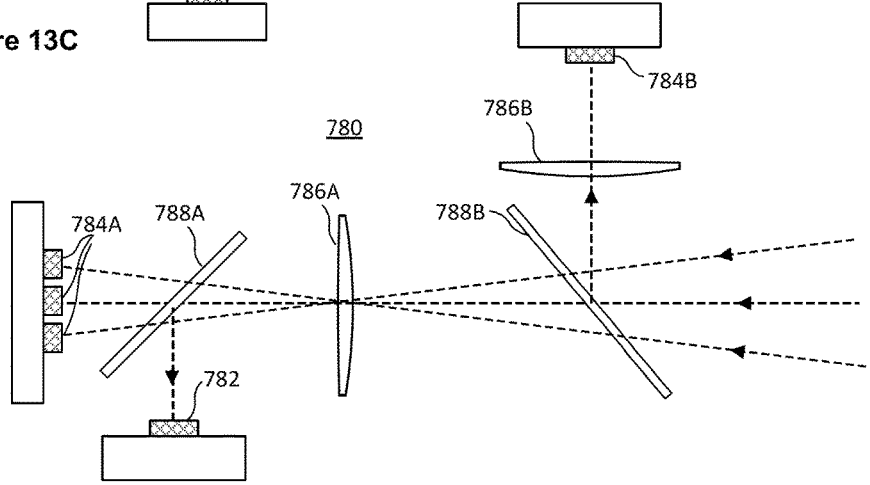

Now referring to FIG. 13D, a receiver 780 includes detectors 782, 784A, and 784B. The first detector 782 is the primary detector configured to detect the light of the emitted pulse scattered by the target. The second detector 784A includes an array of detector elements. The filter 788A can split the light that may be focused onto detectors 782 and 784A by a common optical element 786A. Another filter 788B can split the light in the collimated path from the scanning mirrors. A portion of the light at a third wavelength may be directed by the filter 788B toward the detector 784B. The lens 786B can focus the light at the third wavelength onto the detector 784B. In a sense, the implementation illustrated in FIG. 13B is a combination of the approached illustrated in FIGS. 13B and 13C.

Referring generally to FIGS. 12 and 13A-D, the spatial relationship between FOVs of detectors operating in a receiver may be determined by the fixed positioning of the detectors, the various optical components in the optical path of the input beam (such as the lens 756, 766, 776A, 776B, 786A, 786B), and the scanner. Depending on the implementation, the scanner can be consider to provide a shared input beam with different wavelengths to the different detectors of the receiver, or ensure registration between input beams corresponding to the different detectors of the receiver. In any case, at any point in time, the scanner provides a fixed spatial relationship between the FOV of the primary detector and the FOV of the at least one secondary detector.

Again referring generally to FIGS. 12 and 13A-D, the resolution of data generated using the primary detector (a primary signal corresponding to the primary wavelength) may differ from the resolution of data generated using a secondary detector (a secondary signal corresponding to a secondary wavelength in a scanning lidar system). The resolution may be defined as the number of measurements stored in the memory of a controller for a given angular extent within the FOR. One pixel of the primary signal may correspond to multiple pixels in a secondary signal that cover the same angular extent in the FOR of the lidar, resulting in the secondary signal having a higher angular resolution than the primary signal. Conversely, a single pixel of a secondary signal may cover the same FOV as multiple pixels of the primary signal, resulting in the secondary signal having a lower angular resolution than the primary signal. Generally speaking, an FOV corresponding to a pixel in a passive signal of a scanning lidar system depends on the physical extent of the detector for the signal as well as on the detector response or integration time. For example, a response time of a secondary detector may be 14 µs, while the primary lidar may obtain a new pixel every 1.56 µs, resulting in one secondary signal pixel corresponding to nine primary signal pixels.

For an active detection of a scanning system, a light source may increase the resolution of the signal by limiting the effective FOV for each pixel. For the primary lidar signal, the IFOV illuminated by a laser pulse may limit the extent of the pixel. A secondary signal also may correspond to active detection where a certain light source illuminates the FOV of a secondary detector. A light source may limit the effective FOV of the secondary pixel when the light source illuminates the field of view of a detector for a shorter time than the integration or response time of the detector.

Using Secondary Optical Signals for Multispectral Sensing with Lidar

Figure 14:
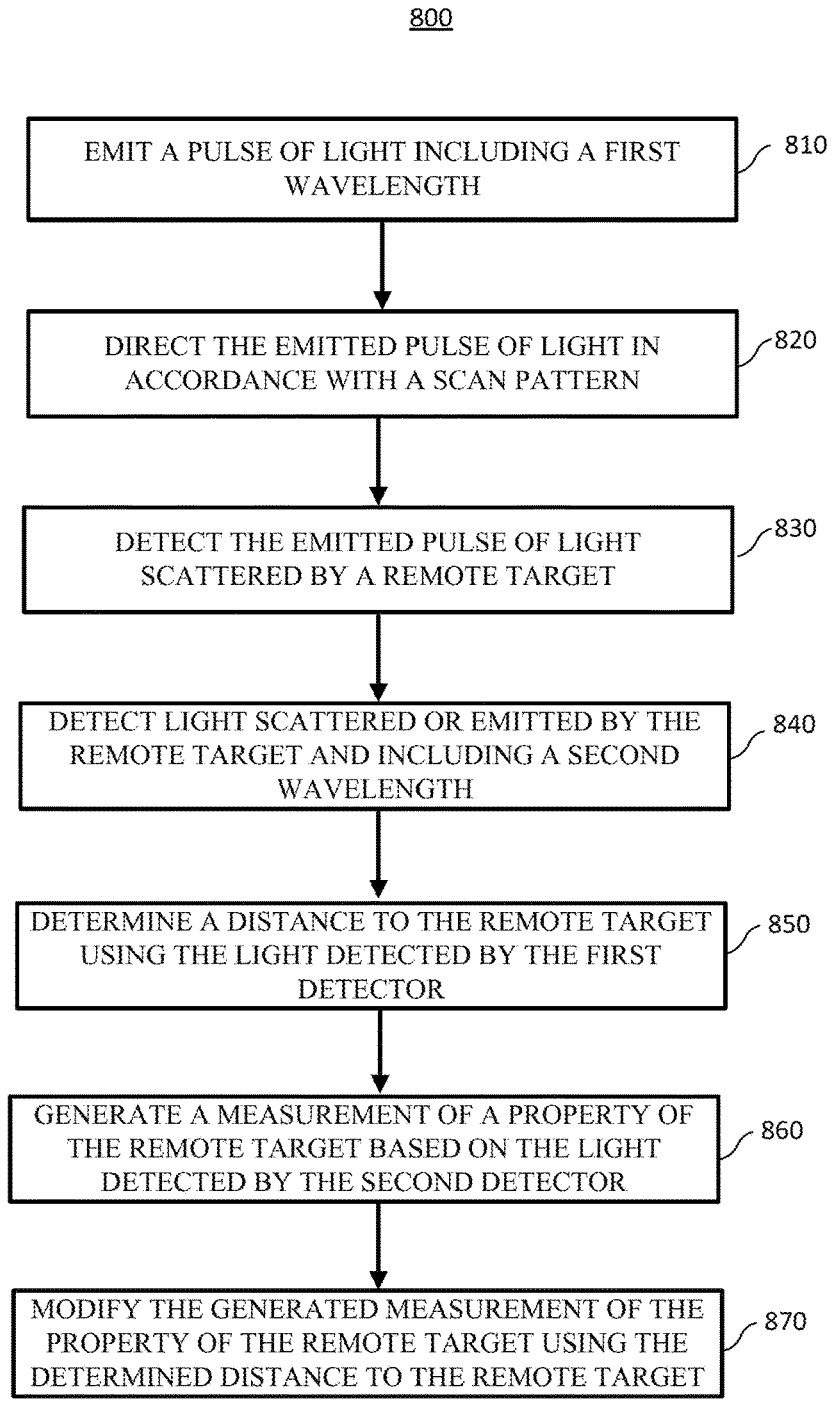
FIG. 14 is a flow diagram of an example method for collecting multispectral information, which can be implemented in the multispectral lidar system of FIG. 12.

Next, FIG. 14 illustrates an example method 800 for collecting multispectral information with a multispectral lidar. At block 810, the lidar may emit a pulse of light from a laser at the first wavelength. At block 820, the scanner directs the emitted pulse toward a target in accordance with a scan pattern.

At block 830, the first, primary detector may detect a portion of the emitted pulse scattered by the remote target. The circuitry connected to the primary detector, such as that illustrated in FIG. 11, may generate a measurement indicative of the round-trip flight time of the pulse. At block 840, the secondary detector may detect light scattered or emitted by the remote target, where the detected light includes the second wavelength. As discussed above, the light scattered or emitted by the remote target may be detected over a time interval that encompasses the detection of the lidar pulse scattered by the target, or may be detected during a different time interval, as determined by the physical relationship between the FOVs of the primary detector and the secondary detector as well as the scan pattern. The controller may adjust the integration time for the secondary light signal in order to achieve the desired signal strength. In some implementations, the response time of the secondary detector may give a practical lower limit for the time duration for collecting the secondary signal.

At block 850, the controller of the lidar system may determine the distance to the target using the light detected by the primary detector and the associated electronic components, as described above. In some implementations, the detection of light by the primary detector also can be used to determine the magnitude of the scattered pulse, which is indicative of the reflectivity of the target.

At block 860, the controller may generate a measurement of a property of the target based on the light detected by the secondary detector. The calculated property may be indicative of one or more of the reflectance, the physical extent (size), the shape, the texture, the velocity, a temperature of the target, etc.

In one example implementation, the signal or data obtained from the secondary detector is used to estimate the temperature of a target within the FOR. Knowledge of target temperature can improve the situational awareness of the system in which the lidar is operating. For example, this data can help the vehicle controller 372 (see FIG. 9) identify humans or animals within the FOR or determine whether vehicles in the field or regard have running engines. For the purpose of detecting temperature, a secondary detector may be configured to detect light in a MWIR or a LWIR band. These infrared bands contain significant portions of radiated energy from objects at moderate temperatures (e.g. 20° F., 50° F., 100° F., 200° F., 500° F.). In general, the relationship between emitted energy per unit area at a given wavelength, i.e. spectral radiance, follows the Plank's equation for black body radiation. For a detector that collects radiation in a band of wavelengths, the relationship between energy and temperature can be calculated by integrating the Plank's equation between two wavelengths. In practice, a calibration procedure can produce a look-up table for the relationship between signal magnitude and temperature of a black body for a given detector configuration.

A target may have an emissivity less than that of a black body, resulting in a lower signal for a given temperature. Estimating the emissivity of a target may help to obtain a more accurate estimate of the temperature of the target. For many opaque targets, the emissivity, E, can be estimated as $E=1-r$, where r is the reflectivity of a target. The reflectivity of a target at the wavelength of the laser of the lidar (primary wavelength) may serve as the estimate of reflectivity at the wavelength used by a secondary detector for temperature measurement. Thus, calculating the reflectivity of a target at the primary wavelength may help to determine the temperature of the target with better accuracy than assuming that the target radiates as a black body.

Figure 15:
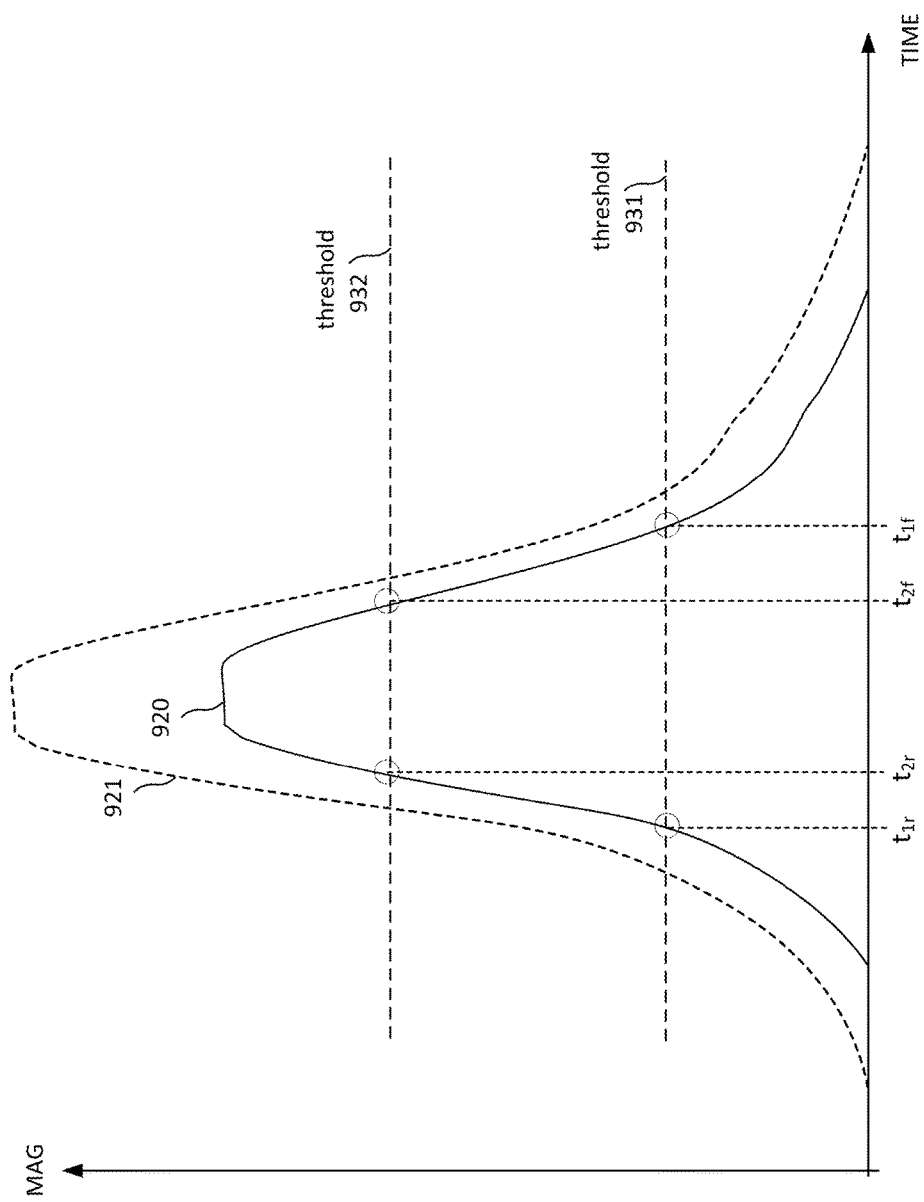
FIG. 15 illustrates an example return pulse that the multispectral lidar system of FIG. 12 can process.

The controller of a multispectral lidar system, or another controller such as the vehicle controller 372 of FIG. 9, may be configured to determine a reflectivity of the target upon determining the distance to the target and the magnitude of a returned pulse. In one implementation, a receiver may estimate the magnitude of a returned pulse using timing information as illustrated in FIG. 15. As illustrated in this example, four timing values may be detected for a return pulse 920. When the rising edge of the return pulse 920 reaches a threshold level 931, the receiver records time $t_{1r}$. When the rising edge of the pulse 920 reaches a higher threshold 932, the receiver records time $t_{2r}$. Falling edge times $t_{1f}$ and $t_{2f}$ represent the times when the falling edge of the pulse 920 descends to the thresholds 932 and 931, respectively. The time difference between $t_{2r}$ and $t_{2f}$ as well as the time difference between $t_{1r}$ and $t_{1f}$ can indicate the magnitude of the returned pulse. For comparison, a higher magnitude return pulse 921 has larger time differences between same levels on the rising and the falling edges than the lower magnitude pulse 920. Moreover, the peak value of a pulse may be proportional to time differences between equal level points on the rising and the falling edges for linear detectors. In another implementation, only one threshold level is required to estimate the magnitude of a pulse. In other implementations, additional levels can increase the accuracy of the estimation of magnitude using additional circuitry in the receiver.

Figure 16:
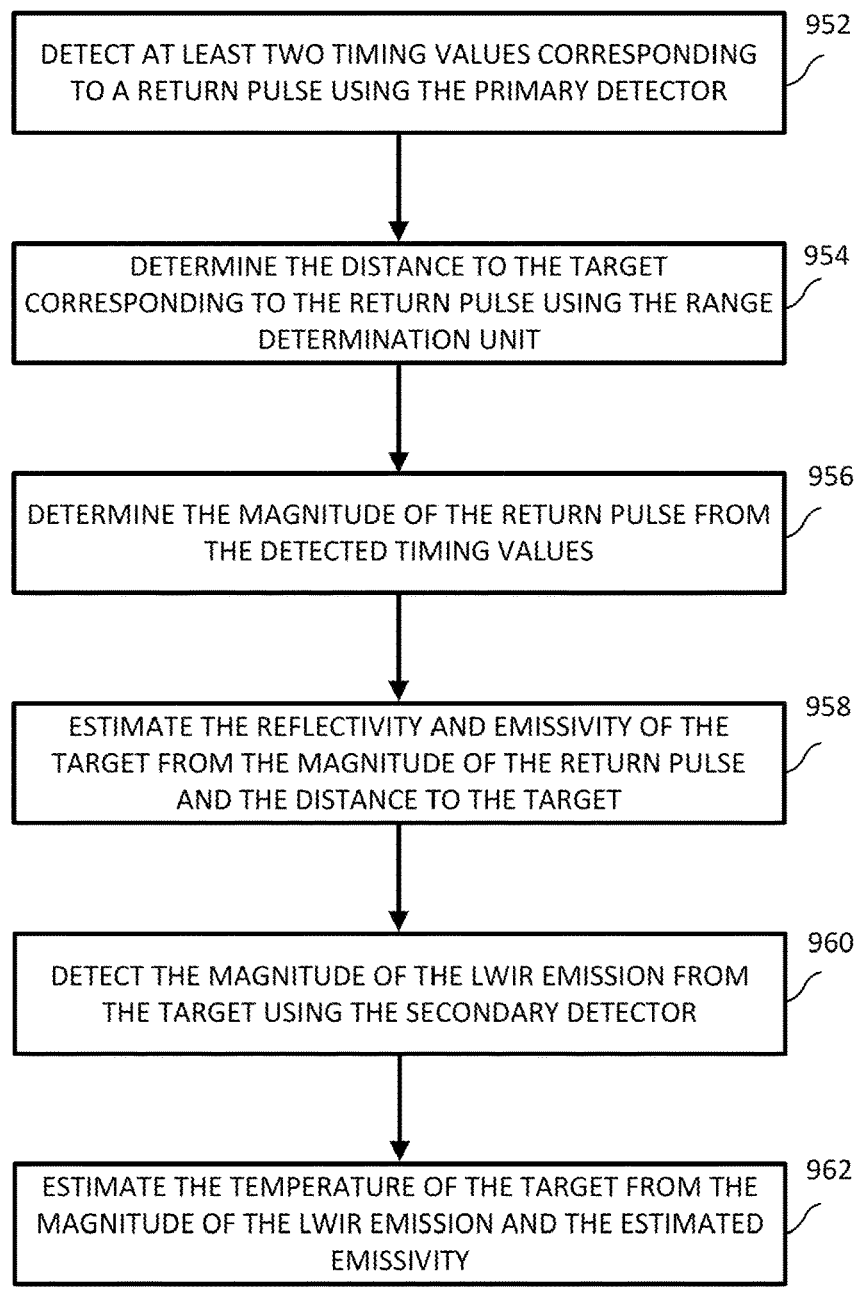
FIG. 16 is a flow diagram of an example method for estimating the temperature of a target, which can be implemented in the multispectral lidar system of FIG. 12.

FIG. 16 illustrates an example method 850 by which the controller of a multispectral lidar system may estimate the temperature of the target. At block 952, the receiver obtains timing values that correspond to the returned pulse, as illustrated in FIG. 15. Each of the timing values may be obtained by a TDC configured to detect when a rising edge or a falling edge crosses a preset threshold. At block 954, the controller may compute the distance to the target as half the product of the speed of light and the delay of the return pulse with respect to the emitted pulse. The controller may use both the rising and falling edge delays for the computation to minimize the dependence of computed distance on the magnitude of the returned pulse, known as the range-walk problem. At block 956, the controller may determine the magnitude of the return pulse from the multiple timing values. At this step the magnitude may be in arbitrary units that are consistent from one measurement to the next.

At block 958, the controller may determine or estimate the reflectivity of the target from the distance to the target and the magnitude of the return pulse. The determination or estimation may also take into account the orientation of the target relative to the lidar beam. The orientation angle may be estimated from the change of distance with respect to position within the field of regard at the current position within the field of regard. The estimation of the orientation angle requires knowing the distances at the neighboring positions within the field of regard and can use the data from the current scan or from a previous scan, depending on the implementation. In some cases, a normal incidence angle may be assumed in cases when a better estimation is not available. Using an incidence angle given by θ, the reflectivity of the target may be estimated as $$r = \frac{MD^2}{M_{ref}D_{ref}^2 \cos\theta}$$

where M is the magnitude of the return pulse, D is the distance to the target, θ is the estimated orientation angle of the target and $M_{ref}$ is the magnitude of the reference pulse returned from a reference unit-reflectivity target at the reference distance $D_{ref}$.

Also at block 958, the system may calculate the emissivity of the target from the reflectivity of the target as E=1−r. In other implementations emissivities of different target may be stored in a table, and the reflectivity of the target may be used as one of the factors that allows target classification and a subsequent look-up of its emissivity at the second wavelength which is used for temperature estimation. At block 960, the receiver uses a secondary detector to detect the magnitude of a light signal including the second wavelength in the LWIR region. In a different implementation, the secondary detector may detect a signal in the MWIR band in order to estimate temperature. A controller of lidar the system ensures that the detected secondary signal is from the same position in the field of regard as the primary lidar signal. In some implementations, the resolution of the data obtained by the second detector such as an LWIR detector may be smaller than the resolution of the data obtained by the first detector that detects the return pulses. In such implementations, the higher resolution primary data may be used by the system to identify the size of an object that can be assumed to be at the same temperature. The primary data can, with signal processing, improve the resolution of secondary thermal data.

At block 962, the system may estimate the temperature of the target by modifying the measurement generated at block 960, i.e. the detected magnitude of the LWIR emission. To do so, the LWIR magnitude detected by the system at block 962 may be normalized or divided by the estimated emissivity of the target (from block 960) before looking up the temperature corresponding to the measurement, $T(M_{LWIR,meas}/E)$ from a look up table, $T(M_{LWIR,ref})$. The look-up table $T(M_{LWIR,ref})$ may store temperature as a function of detected LWIR magnitude generated by a calibration procedure using a black-body target. The table also may be based on the calculation of a black-body radiation curve and optical properties of the LWIR detector (at least in part). In some implementations, additional corrections may be applied to the detected magnitude in order to account for atmospheric loss, reflection of background radiation by the target, or transmission of the target.

In other implementations, a secondary detector may be configured to collect light in the visible region of the spectrum, such as red light, green light, or blue light. A secondary detector also may include separate sensors for red, green, and blue light that can simultaneously detect different color light signals. Furthermore, a secondary detector may include a sensor (or detector) array that can be a monochromatic sensor array or a three-color sensor array. A sensor or detector array may comprise identical detector elements.

Figure 17:
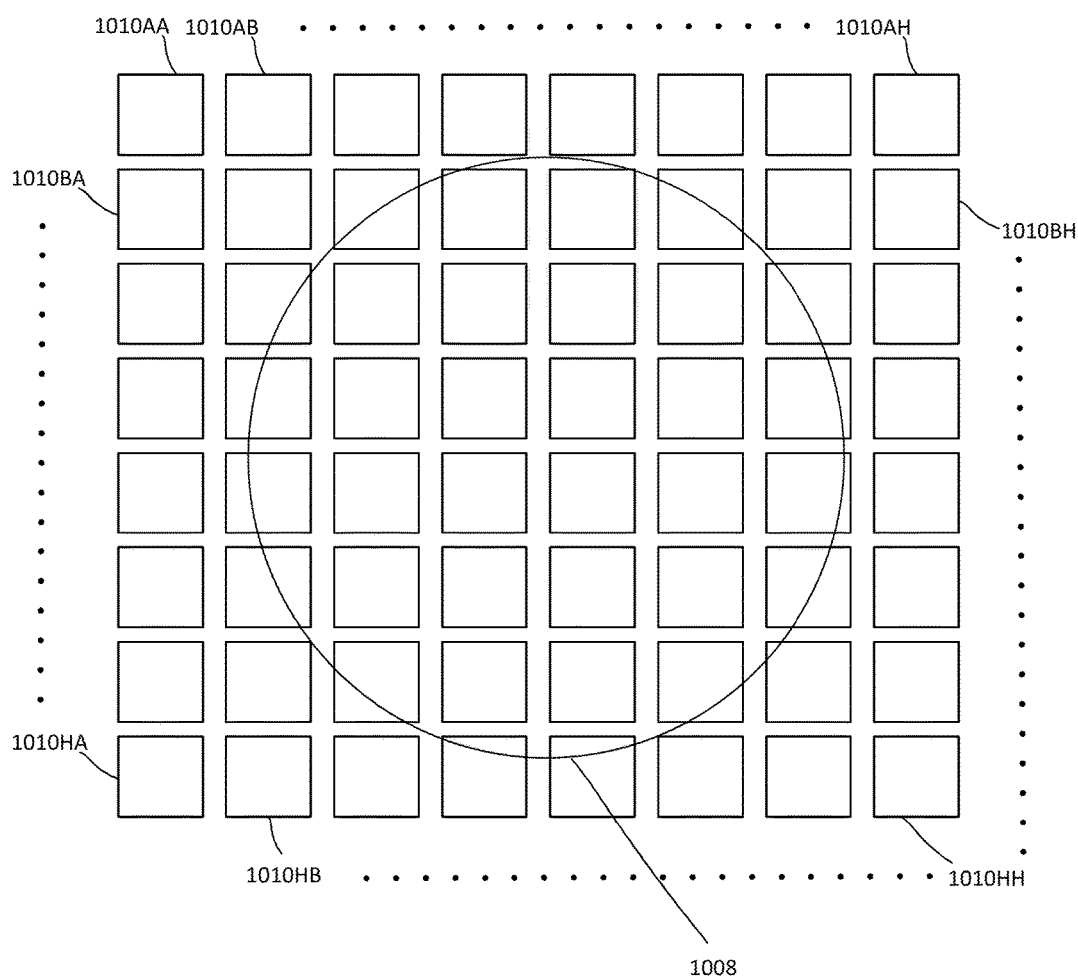
FIG. 17 illustrates a detector array that can be used in the multispectral lidar system of FIG. 12 to generate secondary data at a higher resolution than primary (lidar) data.

A multispectral lidar system may use an array detector to record an image encompassing the FOV of the light source at a certain position within the FOR. As illustrated in FIG. 17, each sensor or detector element of the array in a secondary detector may have a smaller field of view 1010AA through 1010HH that is smaller than the IFOV 1012 of the light source, resulting in higher-resolution secondary data. As indicated above, this higher-resolution secondary data may improve object identification and the situational awareness of the platform on which the multispectral lidar system operates. For example, using the primary detector, a multispectral lidar system may identify a small target, while the secondary detector may collect information at a higher density. The multispectral lidar system may store the higher-density information only for the positions in the FOR that correspond to targets of interest. For example, the primary data may correspond to a point cloud that contains several detected return pulses from a foreground distance that might correspond to a road sign or a small obstacle. The multispectral lidar system may implement a suitable computational engine or send the corresponding higher-density secondary data to the vehicle controller 372 (see FIG. 9) for processing, so as to identify the road sign or the obstacle. This implementation may help to identify objects using fewer computational resources relative to the approach that relies on using lidar information in conjunction with separate high-resolution imaging of the FOR, for example.

Additionally or alternatively, the higher-density secondary data may contain information about the spatial extent (size) of a target with arbitrary scale. For example, an image of an insect that is close to the lidar may occupy as many detector elements in an array sensor as an image of a large bird that is farther from the lidar. One or more primary data points corresponding to the insect or the bird, as described in the example above, may allow a determination of distance to the target, and modification of the image of the target obtained using the secondary detector may allow quantifying the physical scale of the target.

In some implementations, a multispectral lidar system may use a secondary light source to illuminate the FOV of the secondary detector. In this sense, both the primary detector and the secondary data correspond to active sensing. For example, a certain multispectral lidar system may operate as a night-vision system that uses the primary detector to identify targets of interest, simultaneously illuminates targets with a NIR light source, such as a laser, and collects the higher-density information with a NIR array sensor. This implementation allows an energy-efficient use of the secondary light source to illuminate targets of interest and saves computational resources by limiting the processing of image information to specific targets.

General Considerations

In some cases, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In some cases, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various implementations have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately," "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A multispectral lidar system comprising:
   a laser configured to emit a pulse of light including a first wavelength;
   a scanner configured to direct the emitted pulse of light in accordance with a scan pattern;
   a receiver including:
      a first detector configured to detect, over a first angular region defining a first detector field of view (FOV), the emitted pulse of light scattered by a remote target, and
      a second detector configured to detect, over a second angular region defining a second detector FOV, light scattered or emitted by the remote target and including a second wavelength,
   wherein the scanner provides, at any point in time, a fixed spatial relationship between the first detector FOV and the second detector FOV; the lidar system further comprising:
   a controller configured to (i) determine a distance to the remote target using the light detected by the first detector, (ii) generate a measurement of a property of the remote target based on the light detected by the second detector, and (iii) modify the generated measurement of the property of the remote target using the determined distance to the remote target.

2. The multispectral lidar system of claim 1, wherein the measurement of the property generated by the controller indicates a temperature of the remote target.

3. The multispectral lidar system of claim 2, wherein the second detector includes one or more thermal detector elements.

4. The multispectral lidar system of claim 2, wherein the second wavelength is one of (i) a mid-wave infrared or (ii) a long-wave infrared region.

5. The multispectral lidar system of claim 1, wherein the controller is further configured to (i) determine a reflectivity and/or an emissivity of the remote target using the light detected by the first detector, and (ii) modify the generated measurement of the property of the remote target using the determined reflectivity and/or emissivity.

6. The multispectral lidar system of claim 5, wherein the generated measurement includes a magnitude of the light in an infrared region emitted by the remote target and detected by the second detector, and wherein the controller is configured to (i) determine the emissivity of the remote target using the light detected by the first detector, and (ii) determine a temperature of the remote target using the determined emissivity and the magnitude of the light in the infrared region.

7. The multispectral lidar system of claim 1, wherein the controller is further configured to (i) determine a plurality of distances to points on a surface on the remote target using a plurality of respective pulses of light emitted by the laser and detected by the first detector, (ii) determine an orientation of the surface of the target relative to the multispectral lidar system using the determined plurality of distances, and (iii) modify the generated measurement of the property of the remote target using the determined orientation of the surface of the target.

8. The multispectral lidar system of claim 1, wherein the controller is configured to (i) generate, using the light detected by the first detector, first data having a first angular resolution, and (ii) generate, using the light detected by the second detector, second data having a second angular resolution, wherein the first angular resolution is larger than the second angular resolution.

9. The multispectral lidar system of claim 1, wherein the controller is configured to (i) generate, using the light detected by the first detector, first data having a first angular resolution, and (ii) generate, using the light detected by the second detector, second data having a second angular resolution, wherein the first angular resolution is smaller than the second angular resolution.

10. The multispectral lidar system of claim 1, further comprising:
   an optical filtering element configured to (i) receive input light from the scanner, (ii) split the received input light into (i) a first component including the first wavelength and substantially free of the second wavelength, and (ii) a second component including the second wavelength and substantially free of the first wavelength, and (iii) direct the first component and the second component toward the first detector and the second detector, respectively.

11. The multispectral lidar system of claim 10, wherein the optical filtering element includes one of a reflection grating, a transmission grating, a prism, a grism, and interference filter, or a coating applied to a lens.

12. The multispectral lidar system of claim 1, wherein:
the first detector and the second detector are disposed on a same detector plane,
the first detector is positioned on the detector plane to detect the emitted pulse of light scattered by the remote target, when the remote target is within a maximum range of the multispectral lidar system, and
the second detector is positioned on the detector plane so that the emitted pulse of light scattered by the remote target is outside the second detector FOV.

13. The multispectral lidar system of claim 1, wherein the second detector includes a detector array made up of a plurality of identical detector elements.

14. The lidar system of claim 1, further comprising a second light source configured to emit light including the second wavelength, wherein the light detected by the second detector includes the light emitted by the second light source and scattered by the remote target.

15. A method in a multispectral lidar system for multispectral scanning, the method comprising:
emitting a pulse of light including a first wavelength;
directing the generated pulse of light in accordance with a scan pattern;
detecting the emitted pulse of light pulse of light scattered by a remote target, over a first angular region defining a first field of view (FOV);
detecting light scattered or emitted by the remote target and including a second wavelength, over a second angular region defining a second FOV, wherein the first FOV and the second FOV have a fixed spatial relationship in accordance with the scan pattern;
determining a distance to the remote target using the light detected over the first FOV;
generating a measurement of a property of the remote target based on the light detected over the second FOV; and
modifying the generated measurement of the property of the remote target using the determined distance to the remote target.

16. The method of claim 15, wherein generating the measurement of the property of the remote target includes generating a measurement of a temperature of the remote target.

17. The method of claim 16, wherein detecting the light including the second wavelength includes using one or more thermal detector elements.

18. The method of claim 16, wherein the second wavelength is one of (i) a mid-wave infrared or (ii) a long-wave infrared region.

19. The method of claim 15, further comprising:
determining a reflectivity and/or an emissivity of the remote target using the detected light that includes the first wavelength; and
modifying the generated measurement of the property of the remote target using the determined reflectivity and/or emissivity.

20. The method of claim 15, wherein the generated measurement includes a magnitude of the light in an infrared region emitted by the remote target and detected over the second FOV, the method further comprising:
determining the emissivity of the remote target using the light detected over the first FOV; and
determining a temperature of the remote target using the determined emissivity and the magnitude of the light in the infrared region.

21. The method of claim 20, wherein determining the temperature of the remote target using the determined emissivity and the magnitude of the light in the infrared region includes using a look-up table.

22. The method of claim 15, further comprising:
determining a plurality of distances to points on a surface on the remote target using a plurality of respective pulses of light emitted with the first wavelength and detected over the first FOV;
determining an orientation of the surface of the target relative to the multispectral lidar system using the determined plurality of distances; and
modifying the generated measurement of the property of the remote target using the determined orientation of the surface of the target.

23. The method of claim 15, further comprising:
generating, using the light detected over the first FOV, first data having a first angular resolution; and
generating, using the light detected over the second FOV, second data having a second angular resolution, wherein the first angular resolution is larger than the second angular resolution.

24. The method of claim 15, further comprising:
generating, using the light detected over the first FOV, first data having a first angular resolution; and
generating, using the light detected over the second FOV, second data having a second angular resolution, wherein the first angular resolution is smaller than the second angular resolution.

25. The method of claim 15, further comprising emitting light including the second wavelength, wherein the light detected over the second FOV includes the emitted light with the second wavelength and scattered by the remote target.

* * * * *